US011282973B2

(12) United States Patent
Sakai et al.

(10) Patent No.: US 11,282,973 B2
(45) Date of Patent: Mar. 22, 2022

(54) SEMICONDUCTOR DEVICE COMPRISING HALOPALLADATE

(71) Applicant: OXFORD UNIVERSITY INNOVATION LIMITED, Oxford (GB)

(72) Inventors: Nobuya Sakai, Oxford (GB); Amir Abbas Haghighirad, Oxford (GB); Henry James Snaith, Oxford (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 0 days.

(21) Appl. No.: 16/606,008

(22) PCT Filed: Apr. 20, 2018

(86) PCT No.: PCT/GB2018/051043
§ 371 (c)(1),
(2) Date: Oct. 17, 2019

(87) PCT Pub. No.: WO2018/193267
PCT Pub. Date: Oct. 25, 2018

(65) Prior Publication Data
US 2020/0044102 A1 Feb. 6, 2020

(30) Foreign Application Priority Data

Apr. 20, 2017 (GB) .................... 1706285

(51) Int. Cl.
*H01L 31/032* (2006.01)
*H01L 51/42* (2006.01)
(Continued)

(52) U.S. Cl.
CPC .......... *H01L 31/032* (2013.01); *C01G 55/005* (2013.01); *H01L 33/26* (2013.01);
(Continued)

(58) Field of Classification Search
CPC ................. H01L 31/032; H01L 33/26; H01L 51/4213; H01L 51/50; H01L 2031/0344;
(Continued)

(56) References Cited

U.S. PATENT DOCUMENTS 3,979,498 A 9/1976 Campbell

FOREIGN PATENT DOCUMENTS

| WO | 2014045021 A1 | 3/2014 | |
|---|---|---|---|
| WO | WO-2016005758 A1 * | 1/2016 | ........ H01G 9/2027 |
| WO | 2017060700 A1 | 4/2017 | |

OTHER PUBLICATIONS

Giustino, et al., Toward Lead-Free Perovskite Solar Cells, ACS Energy Letters, 2016, 1(6):1233-1240.
(Continued)

*Primary Examiner* — Jayne L Mershon
(74) *Attorney, Agent, or Firm* — Quarles & Brady LLP

(57) ABSTRACT

The present invention relates to a semiconductor device comprising a semiconducting material, wherein the semiconducting material comprises a halometallate compound comprising: (a) cesium; (b) palladium; and (c) one or more halide anions [X]. The invention also relates to a layer comprising the semiconducting material. The invention further relates to a process for producing a halometallate compound of formula (IV): $[A]_2[M^{IV}][X]_6$, which process uses a H[X] and a compound comprising a sulfoxide group.

12 Claims, 13 Drawing Sheets

(51) Int. Cl.
H01L 51/50 (2006.01)
H01L 33/26 (2010.01)
C01G 55/00 (2006.01)
H01L 31/0256 (2006.01)

(52) U.S. Cl.
CPC .......... H01L 51/4213 (2013.01); H01L 51/50 (2013.01); *C01P 2002/72* (2013.01); *C01P 2002/77* (2013.01); *C01P 2002/82* (2013.01); *C01P 2002/84* (2013.01); *C01P 2004/02* (2013.01); *C01P 2004/03* (2013.01); *C01P 2006/40* (2013.01); *H01L 2031/0344* (2013.01); *H01L 2251/301* (2013.01)

(58) Field of Classification Search
CPC ........ H01L 2251/301; H01L 21/02197; C01G 55/005; C01P 2002/72; C01P 2002/77; C01P 2002/82; C01P 2002/84; C01P 2004/02; C01P 2004/03; C01P 2006/40; Y02E 10/549
See application file for complete search history.

(56) References Cited

OTHER PUBLICATIONS

Guo, Potential Thermoelectric Material CS2 [PdCl4]I2: A First-Principles Study, Materials Research Express, 2016, 3:085903, 7 pages.
Haber, Manual on Catalyst Characterization (Recommendations 1991), Pure and Applied Chemistry, 1991, 63 (9):1227-1246.
Kaltzoglou, et al., Optical-Vibrational Properties of the Cs2SnX6 (X= Cl, Br, I) Defect Perovskites and Hole-Transport Efficiency in Dye-Sensitized Solar Cells, Journal of Physical Chemistry C, 2016, 120(22):11777-11785.
Ketelaar, et al., Die Kristallstruktur Des Ammonium-, Kalium-, Rubidium-Und Cäsiumpalladiumhexa-Chlorids Und-Bromids, Recl. Trav. Chim. Pays-Bas, 1938, 57:964-966.
Lee, et al., Air-Stable Molecular Semiconducting Lodosalts for Solar Cell Applications: Cs2SnI6 as a Hole Conductor, Journal of the American Chemical Society, 2014, 136(43):15379-15385.
Li, et al., Structure and Thermoelectric Properties of the Quaternary Compound Cs2 [PdCl4] I2 with Ultralow Lattice Thermal Conductivity, EPL (Europhysics Letters), 2016, 113(5):57007, 6 pages.
Lim, et al., Phase Transition of Cs2PdCl4 Single Crystals as Studied by 133Cs Spin-Lattice Relaxation Time, Physica B, 2005, 368(1-4):297-301.
Maughan, et al., Defect Tolerance to Intolerance in the Vacancy-Ordered Double Perovskite Semiconductors Cs2SnI6 and Cs2TeI6, Journal of the American Chemical Society, 2016, 138(27):8453-8464.

McClure, et al., Cs2AgBiX6 (X= Br, Cl): New Visible Light Absorbing, Lead-Free Halide Perovskite Semiconductors, Chemistry of Materials, 2016, 28(5):1348-1354.
Qiu, et al., Lead-Free Mesoscopic Cs2SnI6 Perovskite Solar Cells Using Different Nanostructured ZnO Nanorods as Electron Transport Layers, Physica Status Solidi RRL, 2016, 10(8):587-591.
Qiu, et al., From Unstable CsSnI3 to Air-Stable Cs2SnI6: A Lead-Free Perovskite Solar Cell Light Absorber with Bandgap of 1.48 eV and High Absorption Coefficient, Solar Energy Materials & Solar Cells, 2017, 159:227-234.
Rouquerol, et al., Recommendations for the Characterization of Porous Solids (Technical Report), Pure and Applied Chemistry, 1994, 66(8):1739-1758.
Sakai, et al., Solution-Processed Cesium Hexabromopalladate (IV), Cs2PdBr6, for Optoelectronic Applications, Journal of the American Chemical Society, 2017, 139(17):6030-6033.
Saparov, et al., Thin-Film Deposition and Characterization of a Sn-Deficient Perovskite Derivative Cs2SnI6, Chemistry of Materials, 2016, 28(7):2315-2322.
Schupp, et al., Crystal Structures and Pressure-Induced Redox Reaction of Cs2PdI4⊙ I2 to Cs2PdI6, Inorganic Chemistry, 2000, 39(4):732-735.
Schupp, et al., Thermal Decomposition of Cs2PdCl6, in the Hasylab 2002 Annual Report Part 1 available at http://hasyweb.desy.de/science/annual_reports/2002_report/part1/contrib/41/6584.pdf, 2 pages.
Sharpe, The Chemistry of the Platinum Metals. Part II. Fluoropalladates and Fluoroplatinates, J Chem Soc, 1953, pp. 197-199.
Sharpe, Chemistry of the Platinum Metals. Part III. Lattice Constants of Some Chloropalladates, Bromopalladates, and Bromoplatinates, J Chem Soc, 1953, pp. 4177-4179.
Shubochkin, et al., Thermal Decomposition of Alkali Metal Halogenopalladates (II) and Halogenopalladates (IV), Russian Journal of Inorganic Chemistry, 1976, 21(9):1413-1414, Translated from Zhurnal Neorganicheskoj Khimii, 1976, 20:2567-2569.
Sing, et al., Reporting Physisorption Data for Gas/Solid Systems with Special Reference to the Determination of Surface Area and Porosity (Recommendations 1984), Pure and Applied Chemistry, 1985, 57(4):603-619.
Slavney, et al., A Bismuth-Halide Double Perovskite with Long Carrier Recombination Lifetime for Photovoltaic Applications, Journal of the American Chemical Society, 2016, 138(7):2138-2141.
Tauc, et al., Optical Properties and Electronic Structure of Amorphous Germanium, Physica Status Solidi, 1966, 15(2):627-637.
Volonakis, et al., Lead-Free Halide Double Perovskites Via Heterovalent Substitution of Noble Metals, Journal of Physical Chemistry Letters, 2016, 7(7):1254-1259.
Williams, et al., Structure Refinement of Potassium Chloroplatinate by Powder and Single-Crystal Methods, Acta Crystallographica Section B: Structural Crystallography and Crystal Chemistry, 1973, B29(7):1369-1372.
Xiao, et al., Intrinsic Defects in a Photovoltaic Perovskite Variant Cs 2 SnI 6, Physical Chemistry Chemical Physics, 2015, 17(29):18900-18903.

* cited by examiner

Fig. 1a
Fig. 1b
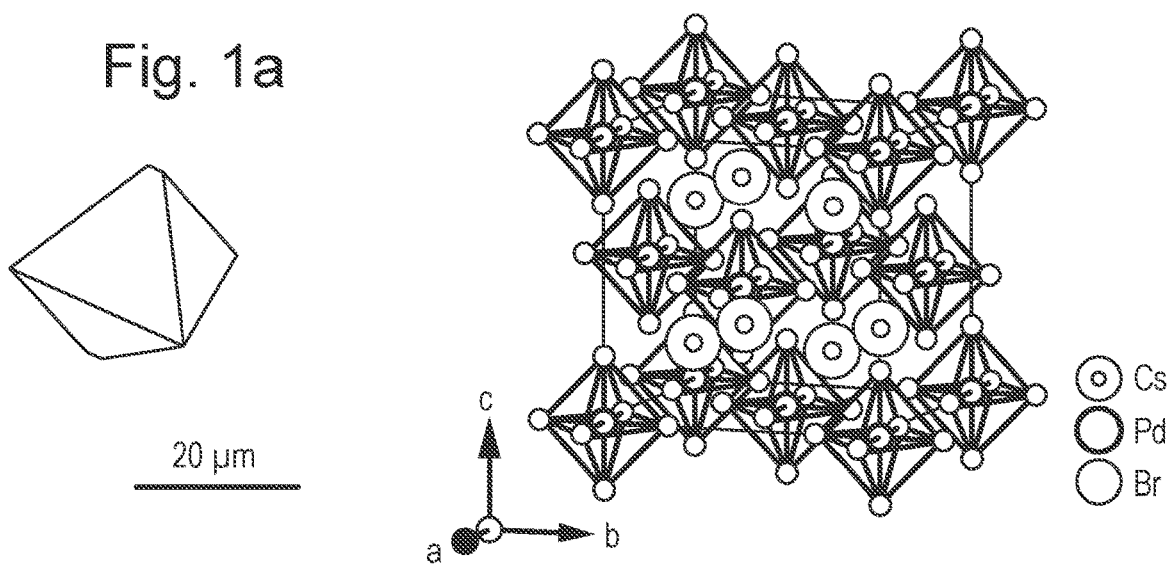
Fig. 2
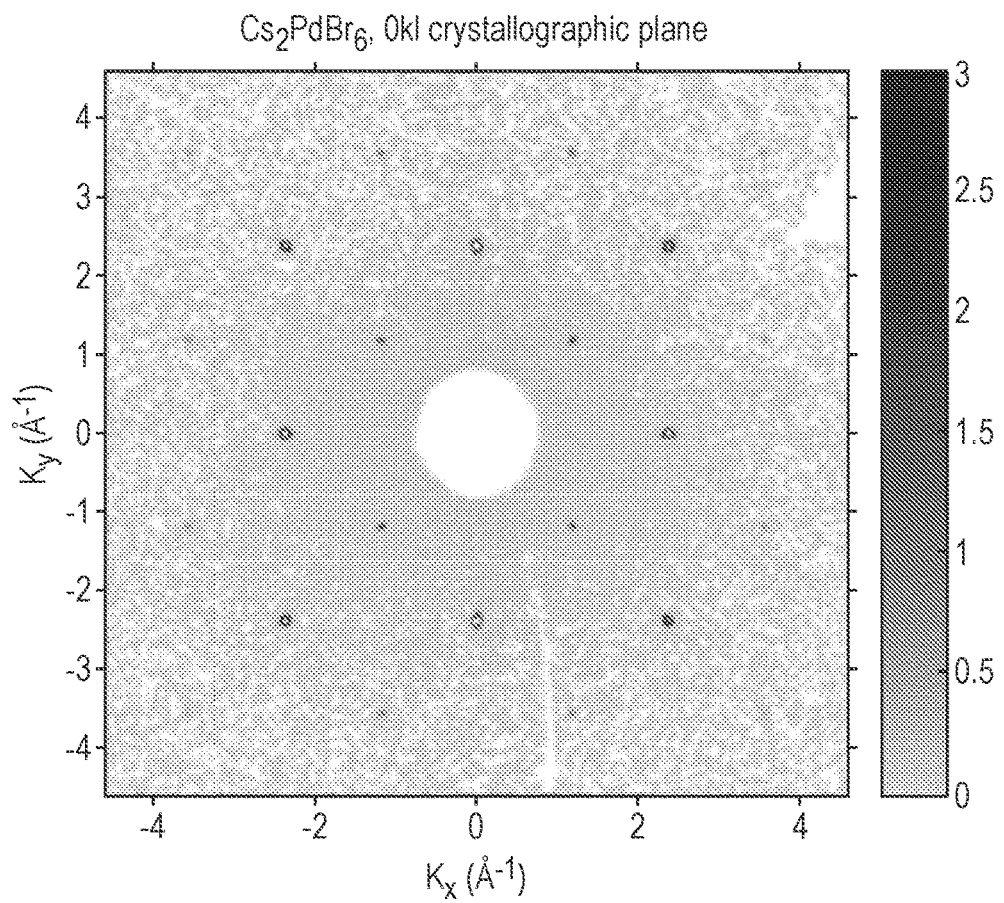

VB maximum = -6.48eV

SEMICONDUCTOR DEVICE COMPRISING HALOPALLADATE

CROSS-REFERENCE TO RELATED APPLICATIONS

This application is a national stage entry of PCT International Application No. PCT/GB2018/051043, filed Apr. 20, 2018, which claims priority to Great Britain Application No. 1706285.2, filed Apr. 20, 2017, both of which are incorporated herein by reference as if set forth in their entirety for all purposes.

FIELD OF THE INVENTION

The present invention relates to a semiconductor device comprising a semiconducting material. A layer comprising the semiconducting material is also described. The invention further relates to a process for producing a halometallate compound.

BACKGROUND OF THE INVENTION

A variety of commonly used electronic devices comprise semiconducting components. Metal halide perovskites are recent examples of semiconducting materials which have been subject to research. Metal halide perovskites have attracted significant attention due to their excellent optoelectronic and photovoltaic properties and the ability to manufacture high quality polycrystalline thin films by low-cost solution processing. Metal halide perovskites have the general formula $ABX_3$, where $A=CH_3NH_3^+$, $HC(NH_2)_2^+$ or $Cs^+$; $B=Pb^{2+}$ or $Sn^{2+}$; and $X=I^-$, $Br^-$ or $Cl^-$. Devices comprising metal halide perovskites are described in WO 2014/045021 and WO 2017/060700.

The presence of lead or tin in metal halide perovskites and the long-term chemical and structural stability of metal halide perovskites are two main issues that need addressing. These issues will have a significant impact on future technologies. Although the presence of lead in the highest quality perovskite semiconductors is most likely tolerable for photo-voltaic solar energy applications, for other applications as semiconductors for electronics and optoelectronics this may constitute a barrier. In particular, those other devices are unlikely to be exempt from compliance to the restriction of hazardous substances (RoHS).

The recently discovered new family of double perovskites with the formula $A_2B'B''X_6$, ($B'=Sb^{3+}$, $Bi^{3+}$ and $B''=Cu^+$, $Ag^+$, $Au^+$) provide a promising environmentally-friendly and stable series of materials for optoelectronic applications (Slavney et al, Am. Chem. Soc. 2016, 138 (7), 2138; Volonakis et al, Phys. Chem. Lett. 2016, 7 (7), 1254; Giustino et al ACS Energy Lett. 2016, 1 (6), 1233; McClure et al, Chem. Mater. 2016, 28 (5), 1348). In addition, it is also possible to replace the B-site cation in $A_2B'B''X_6$ with a vacancy, resulting in a vacancy-ordered defect-variant perovskite with the chemical formula $A_2BX_6$. Recently, $A_2BX_6$ compounds with B=Sn and Te have been reported to absorb light in the visible to infrared (IR) region and provide new opportunities for less-toxic and chemically stable optoelectronic materials (Tei et al, Am. Chem. Soc. 2016, 138 (27), 8453; Lee et al Am. Chem. Soc. 2014, 136 (43), 15379; Saparov et al, Chem. Mater. 2016, 28 (7), 2315). The tin-based material $Cs_2SnI_6$ has attracted attention for potential applications in air-stable optoelectronic devices (Qiu et al, Sol. Energy Mater. Sol. Cells 2017, 159, 227; Qiu, X et al, Phys. status solidi—Rapid Res. Lett. 2016, 591 (8), 587; Kaltzoglou et al, Phys. Chem. C 2016, 120, (22), 11777; Xiao et al, Phys. Chem. Chem. Phys. 2015, 17 (29), 18900). However, $Cs_2SnI_6$ can have defects due to halide and tin vacancies which render it less useful for semiconductor applications.

Palladium-based halometallate compounds are described in: Ketblaar et al (1938), Recl. Trav. Chim. Pays-Bas, 57: 964-966; Schüpp et al, Inorg. Chem., 2000, 39 (4), 732-735; Schüpp, B., Keller, H. L., Oldag, T., & Bähtz, C. "Thermal decomposition of $Cs_2PdCl_6$"; U.S. Pat. No. 3,979,498; Williams et al, Acta Cryst. (1973), B29, 1369-1372; and Sharpe, A. G. "The chemistry of the platinum metals." J. Chem. Soc 197 (1953).

There remains a need for the provision of semiconducting materials for use in semiconductor devices which do not comprise toxic elements such as lead. Furthermore, there is a need for semiconducting materials which may be easily solution processed. There is also a need to develop semiconducting materials which are stable and, in particular, resilient to water.

SUMMARY OF THE INVENTION

The inventors have surprisingly found that cesium halopalladate materials can be used as semiconducting materials in semiconductor devices. It has been found that cesium halopalladate materials are structurally and chemically stable. These materials may be produced by solution processing which allows for the easy production of layers of the material. Furthermore, cesium halopalladate compounds do not comprise toxic compounds such as lead.

The invention therefore provides a semiconductor device comprising a semiconducting material, wherein the semiconducting material comprises a halometallate compound comprising:
(a) cesium;
(b) palladium; and
(c) one or more halide anions [X].

The invention also provides a layer comprising a semiconducting material, wherein the semiconducting material comprises a halometallate compound comprising:
(a) cesium;
(b) palladium; and
(c) one or more halide anions [X].

The invention further provides a process for producing a halometallate compound of formula (IV):

$$[A]_2[M^{IV}][X]_6 \qquad (IV),$$

wherein the process comprises contacting:
a compound of formula [A][X]; with
(ii) a compound of formula $[M^{II}][X]_2$,
in the presence of:
(iii) H[X]; and
(iv) a compound comprising a sulfoxide group,
wherein:
[A] comprises one or more monocations;
$[M^{II}]$ comprises one or more metal dications;
$[M^{IV}]$ comprises one or more metal tetracations; and
[X] comprises the one or more halide anions.

BRIEF DESCRIPTION OF THE FIGURES

FIG. 1 shows (a) an optical microscope image of a $Cs_2PdBr_6$ single crystal and (b) 3D crystal structure of $Cs_2PdBr_6$ showing the unit cell.

FIG. 2 shows the X-ray diffraction pattern of $Cs_2PdBr_6$ on (0 kl) for a single crystal at 300K.

DETAILED DESCRIPTION OF THE INVENTION

Definitions

Figure 3A:
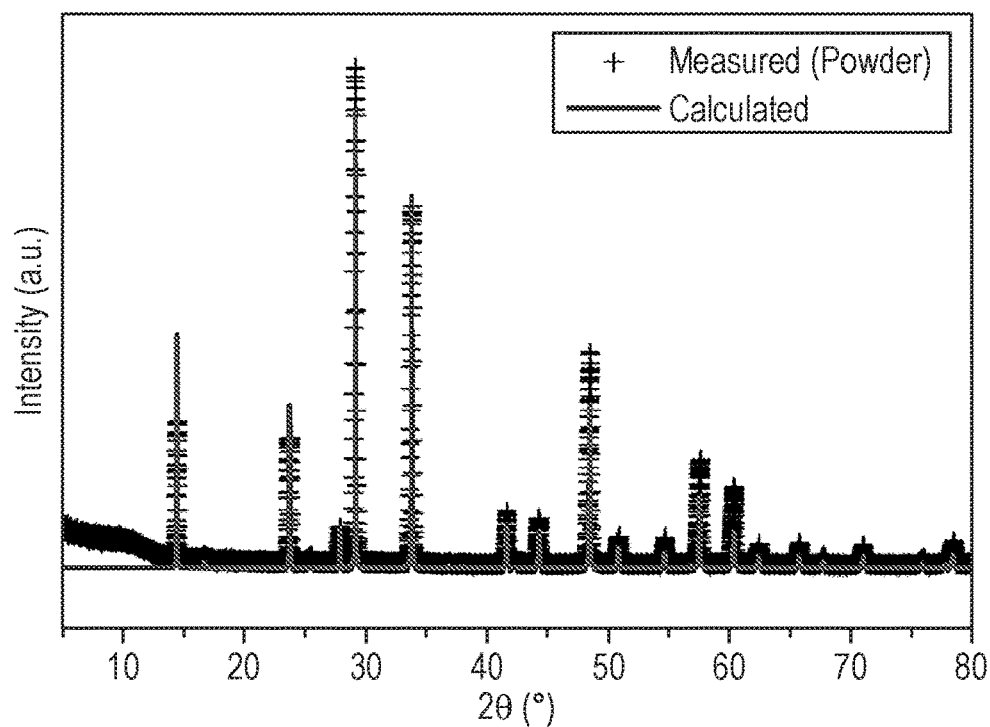
FIG. 3 shows measured and calculated powder X-ray diffraction pattern of $Cs_2PdBr_6$ powder (a) and thin-film (b). * denotes the diffraction peaks from the FTO glass.

The term "alkyl", as used herein, refers to a linear or branched chain saturated hydrocarbon radical. An alkyl group may be a $C_{1-20}$ alkyl group, a $C_{1-14}$ alkyl group, a $C_{1-10}$ alkyl group, a $C_{1-6}$ alkyl group or a $C_{1-4}$ alkyl group. Examples of a $C_{1-10}$ alkyl group are methyl, ethyl, propyl, butyl, pentyl, hexyl, heptyl, octyl, nonyl or decyl. Examples of $C_{1-6}$ alkyl groups are methyl, ethyl, propyl, butyl, pentyl or hexyl. Examples of $C_{1-4}$ alkyl groups are methyl, ethyl, i-propyl, n-propyl, t-butyl, s-butyl or n-butyl. If the term "alkyl" is used without a prefix specifying the number of carbons anywhere herein, it has from 1 to 6 carbons (and this also applies to any other organic group referred to herein).

The term "cycloalkyl", as used herein, refers to a saturated or partially unsaturated cyclic hydrocarbon radical. A cycloalkyl group may be a $C_{3-10}$ cycloalkyl group, a $C_{3-8}$ cycloalkyl group or a $C_{3-6}$ cycloalkyl group. Examples of a $C_{3-8}$ cycloalkyl group include cyclopropyl, cyclobutyl, cyclopentyl, cyclohexyl, cyclohexenyl, cyclohex-1,3-dienyl, cycloheptyl and cyclooctyl. Examples of a $C_{3-6}$ cycloalkyl group include cyclopropyl, cyclobutyl, cyclopentyl, and cyclohexyl.

The term "aryl", as used herein, refers to a monocyclic, bicyclic or polycyclic aromatic ring which contains from 6 to 14 carbon atoms, typically from 6 to 10 carbon atoms, in the ring portion. Examples include phenyl, naphthyl, indenyl, indanyl, anthrecenyl and pyrenyl groups. The term "aryl group", as used herein, includes heteroaryl groups. The term "heteroaryl", as used herein, refers to monocyclic or bicyclic heteroaromatic rings which typically contains from six to ten atoms in the ring portion including one or more heteroatoms. A heteroaryl group is generally a 5- or 6-membered ring, containing at least one heteroatom selected from O, S, N, P, Se and Si. It may contain, for example, one, two or three heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl.

The term "substituted", as used herein in the context of substituted organic groups, refers to an organic group which bears one or more substituents selected from $C_{1-10}$ alkyl, aryl (as defined herein), cyano, amino, nitro, $C_{1-10}$ alkylamino, di($C_{1-10}$)alkylamino, arylamino, diarylamino, aryl($C_{1-10}$)alkylamino, amido, acylamido, hydroxy, oxo, halo, carboxy, ester, acyl, acyloxy, $C_{1-10}$ alkoxy, aryloxy, halo($C_{1-10}$)alkyl, sulfonic acid, thiol, $C_{1-10}$ alkylthio, arylthio, sulfonyl, phosphoric acid, phosphate ester, phosphonic acid and phosphonate ester. Examples of substituted alkyl groups include haloalkyl, perhaloalkyl, hydroxyalkyl, aminoalkyl, alkoxyalkyl and alkaryl groups. When a group is substituted, it may bear 1, 2 or 3 substituents. For instance, a substituted group may have 1 or 2 substitutents.

The term "monocation", as used herein, refers to any cation with a single positive charge, i.e. a cation of formula $A^+$ where A is any moiety, for instance a metal atom or an organic moiety. The term "dication", as used herein, refers to any cation with a double positive charge, i.e. a cation of formula $A^{2+}$ where A is any moiety, for instance a metal atom or an organic moiety. The term "tetracation", as used herein, refers to any cation with a quadruple positive charge, i.e. a cation of formula $A^{4+}$ where A is any moiety, for instance a metal atom.

The term "semiconductor" or "semiconducting material", as used herein, refers to a material with electrical conductivity intermediate in magnitude between that of a conductor and a dielectric. A semiconductor may be an negative (n)-type semiconductor, a positive (p)-type semiconductor or an intrinsic (i) semiconductor. A semiconductor may have a band gap of from 0.5 to 3.5 eV, for instance from 0.5 to 2.5 eV or from 1.0 to 2.0 eV (when measured at 300 K).

The term "semiconductor device", as used herein, refers to a device comprising a functional component which comprises a semiconducting material. This term may be understood to be synonymous with the term "semiconducting device". Examples of semiconductor devices include a photovoltaic device, a solar cell, a photo detector, a photodiode, a photosensor, a chromogenic device, a transistor, a light-sensitive transistor, a phototransistor, a solid state triode, a battery, a battery electrode, a capacitor, a super-capacitor, a light-emitting device and a light-emitting diode. The term "optoelectronic device", as used herein, refers to devices which source, control, detect or emit light. Light is understood to include any electromagnetic radiation. Examples of optoelectronic devices include photovoltaic devices, photodiodes (including solar cells), phototransistors, photomultipliers, photoresistors, light emitting devices, light emitting diodes and charge injection lasers.

The term "n-type region", as used herein, refers to a region of one or more electron-transporting (i.e. n-type) materials. Similarly, the term "n-type layer" refers to a layer of an electron-transporting (i.e. an n-type) material. An electron-transporting (i.e. an n-type) material could, for instance, be a single electron-transporting compound or elemental material. An electron-transporting compound or elemental material may be undoped or doped with one or more dopant elements.

The term "p-type region", as used herein, refers to a region of one or more hole-transporting (i.e. p-type) materials. Similarly, the term "p-type layer" refers to a layer of a hole-transporting (i.e. a p-type) material. A hole-transporting (i.e. a p-type) material could be a single hole-transporting compound or elemental material, or a mixture of two or more hole-transporting compounds or elemental materials. A hole-transporting compound or elemental material may be undoped or doped with one or more dopant elements.

The term "porous", as used herein, refers to a material within which pores are arranged. Thus, for instance, in a porous scaffold material the pores are volumes within the scaffold where there is no scaffold material. The individual pores may be the same size or different sizes. The size of the pores is defined as the "pore size". The limiting size of a pore, for most phenomena in which porous solids are involved, is that of its smallest dimension which, in the absence of any further precision, is referred to as the width of the pore (i.e. the width of a slit-shaped pore, the diameter of a cylindrical or spherical pore, etc.). To avoid a misleading change in scale when comparing cylindrical and slit-shaped pores, one should use the diameter of a cylindrical pore (rather than its length) as its "pore-width" (J. Rouquerol et al., "Recommendations for the Characterization of Porous Solids", Pure & Appl. Chem., Vol. 66, No. 8, pp. 1739-1758, 1994). The following distinctions and definitions were adopted in previous IUPAC documents (K.S.W. Sing, et al, Pure and Appl. Chem., vol. 57, n04, pp 603-919, 1985; and IUPAC "Manual on Catalyst Characterization", J. Haber, Pure and Appl. Chem., vol. 63, pp. 1227-1246, 1991):

micropores have widths (i.e. pore sizes) smaller than 2 nm; Mesopores have widths (i.e. pore sizes) of from 2 nm to 50 nm; and Macropores have widths (i.e. pore sizes) of greater than 50 nm. In addition, nanopores may be considered to have widths (i.e. pore sizes) of less than 1 nm.

Pores in a material may include "closed" pores as well as open pores. A closed pore is a pore in a material which is a non-connected cavity, i.e. a pore which is isolated within the material and not connected to any other pore and which cannot therefore be accessed by a fluid (e.g. a liquid, such as a solution) to which the material is exposed. An "open pore" on the other hand, would be accessible by such a fluid. The concepts of open and closed porosity are discussed in detail in J. Rouquerol et al., "Recommendations for the Characterization of Porous Solids", Pure & Appl. Chem., Vol. 66, No. 8, pp. 1739-1758, 1994.

Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity".

The term "without open porosity", as used herein, therefore refers to a material with no effective open porosity. Thus, a material without open porosity typically has no macropores and no mesopores. A material without open porosity may comprise micropores and nanopores, however. Such micropores and nanopores are typically too small to have a negative effect on a material for which low porosity is desired.

The term "compact layer", as used herein, refers to a layer without mesoporosity or macroporosity. A compact layer may sometimes have microporosity or nanoporosity.

The term "consisting essentially of" refers to a composition comprising the components of which it consists essentially as well as other components, provided that the other components do not materially affect the essential characteristics of the composition. Typically, a composition consisting essentially of certain components will comprise greater than or equal to 95 wt % of those components or greater than or equal to 99 wt % of those components.

Semiconductor Device

The invention provides a semiconductor device comprising a semiconducting material, wherein the semiconducting material comprises a halometallate compound comprising: (a) cesium; (b) palladium; and (c) one or more halide anions [X].

Halometallate compounds are typically compounds which comprise one or more halometallate anions. Halometallate anions typically comprise one or more halide anions bonded to a central metal atom. An example of a halometallate anion is $[PdX_6]^{2-}$, where X is a halide.

In the halometallate compound, the cesium is typically in the form of a cation, for instance $Cs^+$. In the halometallate compound, the palladium is typically in the form of a cation, for instance $Pd^{2+}$ or $Pd^{4+}$. Reference to palladium being in the form of a cation includes reference to palladium forming the high oxidation state atom in a halometallate anion.

The one or more halide anions [X] are typically selected from $Br^-$, $Cl^-$ and $I^-$. [X] may be one, two, three or four different halide anions. If [X] comprises two or more halide anions, those two or more halide anions may be present in any proportion. The notation "[X]" means that the semiconducting material may comprise a set of halide anions, which halide anions may be present in any proportion. [X] may alternatively be represented by a list of the halide ions present, for instance ($Br^-$, $Cl^-$). The list of halide anions present may be represented in a formula for the semiconducting material as, for example, $Br_xCl_{(1-x)}$, where x is from 0 to 1.

Typically, [X] comprises Br⁻ and/or Cl⁻. In some case, [X] comprises Br⁻ or Cl⁻. Preferably, [X] comprises Br⁻.

Typically, the semiconducting material comprises a halometallate compound of formula (I):

$$[A]_a[M]_b[X]_c \qquad (I),$$

wherein: [A] comprises Cs⁺; [M] comprises $Pd^{2+}$ or $Pd^{4+}$; [X] comprises the one or more halide anions; a is from 1 to 4; b is from 1 to 2; and c is from 3 to 8.

For instance, if [A] is Cs⁺, [M] is $Pd^{4+}$ and [X] comprises two halide anions ($X^1$ and $X^2$), the semiconducting material may comprise a compound of formula $Cs_aPd_b(X^1,X^2)_c$, where a is from 1 to 4; b is from 1 to 2; and c is from 3 to 8. Such a compound is a mixed halide compound. For instance, if [A] is Cs⁺, [M] comprises $Pd^{4+}$ and $Sn^{4+}$ and [X] is Br⁻, the semiconducting material may comprise a compound of formula $Cs_a(Pd,Sn)_bBr_c$, where a is from 1 to 4; b is from 1 to 2; and c is from 3 to 8. Such a compound is a mixed metal compound.

Typically, [A] is Cs⁺. In some cases, [A] may comprise Cs⁺ and one or more monocations. The one or more monocations may be selected from K⁺, Rb⁺, $(NR_4)^+$, $(R_2N=CR_2)^+$, $(R_2N-C(R)=NR_2)^+$ and $(R_2N-C(NR_2)=NR_2)^+$, wherein each R group is independently H, a substituted or unsubstituted $C_{1-20}$ alkyl group or a substituted or unsubstituted aryl group, and wherein two or more R groups are optionally joined together to form a ring. The one or more monocations may for instance be selected from $(NH_4)^+$, $(CH_3NH_3)^+$, $(HOCH_2NH_3)^+$, $(CH_3CH_2NH_3)^+$, $(H_2N-C(H)=NH_2)^+$ and $(H_2N-C(NH_2)=NH_2)^+$.

Typically, [M] is $Pd^{2+}$ or $Pd^{4+}$. Preferably, [M] is $Pd^{4+}$.

In some cases, [M] may comprise $Pd^{2+}$ and one or more metal dications. The one or more metal dications may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Ge^{2+}$, $Sn^{2+}$, $Pb^{2+}$, $Yb^{2+}$ and $Eu^{2+}$. In some cases, [M] may comprise $Pd^{4+}$ and one or more metal tetracations. The one or more metal tetracations may be selected from $W^{4+}$, $Re^{4+}$, $Os^{4+}$, $Ir^{4+}$, $Pt^{4+}$, $Sn^{4+}$, $Pb^{4+}$, $Ge^{4+}$, and $Te^{4+}$.

For instance, [M] may comprise $Pd^{2+}$ and $Pb^{2+}$ or [M] may comprise $Pd^{4+}$ and $Pb^{2+}$.

Typically, a is from 1 to 3, for instance 1 or 2. Typically, b is 1. Typically, c is from 4 to 6, for instance 4 or 6.

Typically, the semiconducting material comprises a halometallate compound of formula (II):

$$[A]_2[M][X]_6 \qquad (II),$$

wherein: [A] comprises Cs⁺; [M] comprises $Pd^{4+}$; [X] comprises the one or more halide anions.

The halometallate compound of formula (II) may be selected from $Cs_2PdBr_6$, $Cs_2PdCl_6$, $Cs_2PdI_6$, $Cs_2PdBr_{6x}Cl_{6(1-x)}$, $Cs_2PdBr_{6x}I_{6(1-x)}$ and $Cs_2PdI_{6x}Cl_{6(1-x)}$, where x is from 0 to 1. x may for instance be from 0.1 to 0.9. Such compounds may be referred to as cesium hexahalopalladates.

Typically, the semiconducting material comprises a halometallate compound selected from the group consisting of $Cs_2PdBr_6$, $Cs_2PdCl_6$ and $Cs_2PdI_6$. Preferably, the semiconducting material comprises $Cs_2PdBr_6$.

In some cases, the semiconducting material comprises a halometallate compound of formula (III):

$$[A]_2[M][X]_4 \qquad (III),$$

wherein: [A] comprises Cs⁺; [M] comprises $Pd^{2+}$; [X] comprises the one or more halide anions.

The halometallate compound of formula (III) may be selected from $Cs_2PdBr_4$, $Cs_2PdCl_4$, $Cs_2PdI_4$, $Cs_2PdBr_{4x}Cl_{4(1-x)}$, $Cs_2PdBr_{4x}I_{4(1-x)}$ and $Cs_2PdI_{4x}Cl_{4(1-x)}$, where x is from 0 to 1. x may for instance be from 0.1 to 0.9. Such compounds may be referred to as cesium tetrahalopalladates.

Typically, the semiconducting material comprises a halometallate compound selected from the group consisting of $Cs_2PdBr_4$, $Cs_2PdCl_4$ and $Cs_2PdI_4$. For instance, the semiconducting material may comprise $Cs_2PdBr_4$.

The semiconductor device may be an optoelectronic device, a transistor, a solid state triode, a battery, a battery electrode, a capacitor or a super-capacitor.

Typically, the semiconductor device is an optoelectronic device. Preferably, the semiconductor device is a photovoltaic device, a light-emitting device (for instance a light emitting diode) or a photodetector. Most preferably, the semiconductor device is a photovoltaic device. When the semiconductor device is an optoelectronic device, the semiconducting material is typically a photoactive material. In some cases, the semiconducting material is a photoabsorbant material or a photoemissive material.

The semiconducting material may comprise greater than or equal to 50 wt % of the halometallate compound. The semiconducting material may comprise additional components. In particular, the semiconducting material may comprise one or more dopant compounds. Typically, the semiconducting material comprises greater than or equal to 80 wt % of the halometallate compound. Preferably, the semiconducting material comprises greater than or equal to 95 wt % of the halometallate compound as defined herein (e.g. $Cs_2PdBr_6$, $Cs_2PdCl_6$ and $Cs_2PdI_6$), for instance greater than or equal to 99 wt % of the halometallate compound as defined herein. The semiconducting material may consist, or consist essentially, of the halometallate compound.

The semiconducting material is typically solid. Typically, the semiconducting material comprises crystalline material. The semiconducting material may be crystalline or polycrystalline. For instance the semiconducting material may comprise a plurality of crystallites of the compound.

The semiconducting material may be in any suitable form. Typically the semiconducting material is in the form of a layer, for instance a photoactive, photoemissive or photoabsorbent material in the form of a layer. The semiconducting material typically comprises a layer of the halometallate compound. The semiconducting material may consist essentially of a layer of the halometallate compound. The semiconductor device may comprise a layer of said semiconducting material (for instance a photoactive material).

Typically, the semiconductor device comprises a layer of the semiconducting material. The layer of the semiconducting material typically has a thickness of from 5 nm to 5000 nm. Often, the layer of the semiconducting material has a thickness of greater than or equal to 50 nm, or a thickness of greater than or equal to 100 nm. In some cases, the layer has a thickness of from 5 nm to 1000 nm. Preferably, the layer of the semiconducting material has a thickness of from 100 nm to 700 nm, for instance from 200 nm to 500 nm. The layer of the semiconducting material may consist, or consist essentially of a layer of the halometallate compound having a thickness of from 100 nm to 700 nm. In some devices, the layer of the semiconducting material may be a thin sensitising layer, for instance having a thickness of from 5 nm to 50 nm. In devices wherein the layer of said semiconducting material forms a planar heterojunction with an n-type or p-type region, the layer of the semiconducting material may have a thickness of greater than or equal to 100 nm, for instance from 100 nm to 700 nm, or from 200 nm to 500 nm. The term "planar heterojunction", as used herein, means that surface defining the junction between the semiconducting material and the n- or p-type region is substantially planar and has a low roughness, for instance a root mean squared roughness of less than 20 nm over an area of 25 nm by 25 nm, for instance a root mean squared roughness of less than 10 nm, or less than 5 nm, over an area of 25 nm by 25 nm. This may be measured by atomic force microscopy.

The semiconducting material typically acts as a photoactive component (e.g. a photoabsorbent component or a photoemissive component) within the semiconductor device. The semiconducting material may alternatively act as a p-type semiconductor component, an n-type semiconductor component, or an intrinsic semiconductor component in the semiconductor device. For instance, the semiconducting material may form a layer of a p-type, n-type or intrinsic semiconductor in a transistor, e.g. a field effect transistor. For instance, the semiconducting material may form a layer of a p-type or n-type semiconductor in an optoelectronic device, e.g. a solar cell or an LED.

Typically, the semiconductor device comprises: an n-type region comprising at least one n-type layer; a p-type region comprising at least one p-type layer; and, disposed between the n-type region and the p-type region: a layer of said semiconducting material. An n-type layer is typically a layer of an n-type semiconductor. A p-type layer is typically a layer of a p-type semiconductor.

The n-type region comprises at least one n-type layer. The n-type region may comprise an n-type layer and an n-type exciton blocking layer. Such an n-type exciton blocking layer is typically disposed between the n-type layer and the layer comprising the semiconducting material. The n-type region may have a thickness of from 1 nm to 1000 nm. For instance, the n-type region may have a thickness of from 5 nm to 500 nm, or from 10 nm to 300 nm.

Preferably, the n-type region comprises a compact layer of an n-type semiconductor.

The n-type semiconductor may be selected from a metal oxide, a metal sulphide, a metal selenide, a metal telluride, a perovskite, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped. Typically, the n-type semiconductor is selected from a metal oxide, a metal sulphide, a metal selenide, and a metal telluride. For instance, the n-type region may comprise an inorganic material selected from oxide of titanium, tin, zinc, niobium, tantalum, tungsten, indium, gallium, neodymium, palladium, or cadmium, or an oxide of a mixture of two or more of said metals. For instance, the n-type layer may comprise $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, or $CdO$.

Typically, the n-type region comprises $SnO_2$ or $TiO_2$, for instance a compact layer of $TiO_2$. Often, the n-type region also comprises a layer of a fullerene or a fullerene derivative (for instance $C_{60}$ or Phenyl-C61-butyric acid methyl ester (PCBM)).

The p-type region comprises at least one p-type layer. The p-type region may alternatively comprise an p-type layer and a p-type exciton blocking layer. Such a p-type exciton blocking layer is typically disposed between the p-type layer and the layer comprising the semiconducting material. The p-type region may have a thickness of from 1 nm to 1000 nm. For instance, the p-type region may have a thickness of from 5 nm to 500 nm, or from 10 nm to 300 nm.

Preferably, the p-type region comprises a compact layer of a p-type semiconductor Suitable p-type semiconductors may be selected from polymeric or molecular hole transporters. The p-type layer employed in the semiconductor device of the invention may for instance comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]), PVK (poly(N-vinylcarbazole)), HTM-TFSI (1-hexyl-3-methylimidazolium bis(trifluoromethylsulfonyl)imide), Li-TFSI (lithium bis(trifluoromethanesulfonyl)imide) or tBP (tert-butylpyridine). The p-type region may comprise carbon nanotubes. Usually, the p-type material is selected from spiro-OMeTAD, P3HT, PCPDTBT and PVK. Preferably, the p-type layer employed in the optoelectronic device of the invention comprises spiro-OMeTAD.

In some embodiments, the p-type layer may comprise an inorganic hole transporter. For instance, the p-type layer may comprise an inorganic hole transporter comprising an oxide of nickel, vanadium, copper or molybdenum; CuI, CuBr, CuSCN, $Cu_2O$, CuO or CIS; a perovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. The p-type layer may be a compact layer of said inorganic hole transporter.

In some cases, the semiconductor device comprises a layer of the semiconducting material without open porosity. The layer of the semiconducting material without open porosity is typically a layer of a halometallate compound as described herein without open porosity. Thus, the layer of the semiconducting material may comprise greater than or equal to 95 volume % of the semiconducting material (and thus less than 5 volume % of absence pore volume). As described above, a layer without open porosity is a layer which typically does not comprise macropores or mesopores.

The layer of the semiconducting material typically forms a planar heterojunction with the n-type region or the p-type region. The layer of the semiconducting material typically forms a first planar heterojunction with the n-type region and a second planar heterojunction with the p-type region. This forms a planar heterojunction device. The term "planar heterojunction" as used herein refers to a junction between two regions where one region does not infiltrate the other. This does not require that the junction is perfectly smooth, just that one region does not substantially infiltrate pores in the other region.

When the layer of the semiconducting material forms a planar heterojunction with both the p-type and the n-type region, this typically forms a thin film device. The thickness of the layer of the semiconducting material may be greater than or equal to 10 nm. Preferably, the thickness of the layer of the semiconducting material is greater than or equal to 100 nm, for instance from 100 nm to 700 nm.

In some embodiments, it is desirable to have a porous scaffold material present. The layer of a porous scaffold is usually in contact with an n-type compact layer or a p-type compact layer. The layer of a porous scaffold is usually also in contact with the semiconducting material. The scaffold material is typically mesoporous or macroporous. The scaffold material may aid charge transport from the semiconducting material to an adjacent region. The scaffold material may also, or alternatively, aid formation of the layer of the semiconducting material during device construction. The porous scaffold material is typically infiltrated by the semiconducting material.

Thus, in some embodiments, the semiconductor device comprises: an n-type region comprising at least one n-type layer; a p-type region comprising at least one p-type layer; and, disposed between the n-type region and the p-type region: (i) a porous scaffold material; and (ii) said semiconducting material in contact with the scaffold material.

The semiconducting material in contact with the porous scaffold material may form a sensitizing layer of the semiconducting material. Thus, the semiconducting device may be a cesium halopalladate-sensitized device. The porous scaffold material may be a charge-transporting scaffold material (e.g. an electron-transporting material such as titania, or alternatively a hole transporting material) or a dielectric material, such as alumina. The term "dielectric material", as used herein, refers to material which is an electrical insulator or a very poor conductor of electric current. The term dielectric therefore excludes semiconducting materials such as titania. The term dielectric, as used herein, typically refers to materials having a band gap of equal to or greater than 4.0 eV. (The band gap of titania is about 3.2 eV.) The skilled person of course is readily able to measure the band gap of a semiconductor (including that of a double perovskite compound) by using well-known procedures which do not require undue experimentation. For instance, the band gap of a semiconductor can be estimated by constructing a photovoltaic diode or solar cell from the semiconductor and determining the photovoltaic action spectrum as described above. Alternatively the band gap can be estimated by measuring the light absorption spectra either via transmission spectrophotometry or by photo thermal deflection spectroscopy. The band gap can be determined by making a Tauc plot, as described in Tauc, J., Grigorovici, R. & Vancu, a. Optical Properties and Electronic Structure of Amorphous Germanium. Phys. Status Solidi 15, 627-637 (1966) where the square of the product of absorption coefficient times photon energy is plotted on the Y-axis against photon energy on the x-axis with the straight line intercept of the absorption edge with the x-axis giving the optical band gap of the semiconductor.

The semiconducting material typically has a band gap of from 1.1 to 2.8 eV. The semiconducting material may have a band gap of from 1.1 to 2.0 eV, for instance from 1.3 to 1.8 eV.

The semiconductor device typically further comprises one or more first electrodes and one or more second electrodes. The one or more first electrodes are typically in contact with the n-type region, if such a region is present. The one or more second electrodes are typically in contact with the p-type region, if such a region is present. Typically: the one or more first electrodes are in contact with the n-type region and the one or more second electrodes are in contact with the p-type region; or the one or more first electrodes are in contact with the p-type region and the one or more second electrodes are in contact with the n-type region.

The first and second electrode may comprise any suitable electrically conductive material. The first electrode typically comprises a transparent conducting oxide. The second electrode typically comprises one or more metals. The second electrode may alternatively comprise graphite. Typically, the first electrode typically comprises a transparent conducting oxide and the second electrode typically comprises one or more metals.

The transparent conducting oxide may be as defined above and is often FTO, ITO, or AZO, and typically ITO. The metal may be any suitable metal. Generally the second electrode comprises a metal selected from silver, gold, copper, aluminium, platinum, palladium, or tungsten. The electrodes may form a single layer or may be patterned.

A semiconductor device according to the invention, for instance a sensitized solar cell, may comprise the following layers in the following order:
  I. one or more first electrodes as defined herein;
  II. optionally a compact layer of an n-type material as defined herein;
  III. a porous layer of an n-type material as defined herein;
  IV. a layer of said semiconducting material;
  V. a p-type region as defined herein;
  VI. optionally a further compact p-type layer as defined herein; and
  VII. one or more second electrodes as defined herein.

A semiconductor device according to the invention which is a photovoltaic device may comprise the following layers in the following order:
  I. one or more first electrodes as defined herein;
  II. an n-type region comprising at least one n-type layer as defined herein;
  III. a layer of the semiconducting material comprising the halometallate compound as defined herein;
  IV. a p-type region comprising at least one p-type layer as defined herein; and
  V. one or more second electrodes as defined herein.

The one or more first electrodes may have a thickness of from 100 nm to 700 nm, for instance of from 100 nm to 400 nm. The one or more second electrodes may have a thickness of from 10 nm to 500 nm, for instance from 50 nm to 200 nm or from 10 nm to 50 nm. The n-type region may have a thickness of from 50 nm to 500 nm. The p-type region may have a thickness of from 50 nm to 500 nm.

Layer of a Semiconducting Material

The invention also provides a layer comprising a semiconducting material, wherein the semiconducting material comprises a halometallate compound comprising: (a) cesium; (b) palladium; and (c) one or more halide anions [X]. The halometallate compound may be as defined herein. For instance, the layer may comprise or consist essentially of a halometallate compound selected from $Cs_2PdBr_6$, $Cs_2PdCl_6$, $Cs_2PdI_6$, $Cs_2PdBr_{6x}Cl_{6(1-x)}$, $Cs_2PdBr_{6x}I_{6(1-x)}$, $Cs_2PdI_{6x}Cl_{6(1-x)}$, $Cs_2PdBr_4$, $Cs_2PdCl_4$, $Cs_2PdI_4$, $Cs_2PdBr_{4x}Cl_{4(1-x)}$, $Cs_2PdBr_{4x}I_{4(1-x)}$ and $Cs_2PdI_{4x}Cl_{4(1-x)}$, where x is from 0 to 1. Typically, the layer comprises or consists essentially of $Cs_2PdBr_6$, $Cs_2PdCl_6$, $Cs_2PdI_6$.

The layer typically has a thickness of from 5 nm to 5000 nm. The layer may for instance have a thickness of from 50 nm to 1000 nm or of from 100 nm to 700 nm. The surface area of the layer may be greater than or equal to 1.0 mm$^2$ or greater than or equal to 1.0 cm$^2$.

The layer of the semiconducting material is typically disposed on a substrate. The substrate may be as defined herein for the first electrode. The substrate may for instance comprise a layer of glass, a layer of a polymer or a layer of a metal (for instance a metal foil). Additional layers may be disposed between the substrate and the layer of the semiconducting material.

Process

The invention also provides a process for producing a halometallate compound of formula (IV):

$$[A]_2[M^{IV}][X]_6 \qquad (IV),$$

wherein the process comprises contacting: (i) a compound of formula [A][X]; with (ii) a compound of formula $[M^{II}][X]_2$, in the presence of: (iii) H[X]; and (iv) a compound comprising a sulfoxide group, wherein: [A] comprises one or more monocations; $[M^{II}]$ comprises one or more metal dications; $[M^{IV}]$ comprises one or more metal tetracations; and [X] comprises the one or more halide anions.

Contacting a compound of formula [A][X] with a compound of formula $[M^{II}][X]_2$ typically comprises dissolving the two compounds in a solvent to form a solution. The solvent may be polar or non-polar. The solvent is typically a polar solvent. Typically, the solvent comprises water, an alcohol (such as methanol or ethanol), dichlormethane, acetonitrile, dimethylsulfoxide (DMSO) or dimethylformamide (DMF). Often, the solvent comprises water.

The presence of H[X] and a compound comprising a sulfoxide group typically means that H[X] and a compound comprising a sulfoxide group are added to, or already present in, the solution comprising a compound of formula [A][X] and a compound of formula $[M^{II}][X]_2$.

Typically, the one or more monocations [A] are selected from $Cs^+$, $K^+$, $Rb^+$, $(NR_4)^+$, $(R_2N=CR_2)^+$, $(R_2N-C(R)=NR_2)^+$ and $(R_2N-C(NR_2)=NR_2)^+$, wherein each R group is independently H, a substituted or unsubstituted $C_{1-20}$ alkyl group or a substituted or unsubstituted aryl group, and wherein two or more R groups are optionally joined together to form a ring. The one or more monocations [A] may for instance be selected from $Cs^+$, $(NH_4)^+$, $(CH_3NH_3)^+$, $(HOCH_2NH_3)^+$, $(CH_3CH_2NH_3)^+$, $(H_2N-C(H)=NH_2)^+$ and $(H_2N-C(NH_2)=NH_2)^+$. Preferably, the one or more monocations [A] comprise $Cs^+$, for instance as a single monocation.

Typically, the one or more metal dications $[M^{II}]$ are selected from $Pd^{2+}$, $Pb^{2+}$, $Ge^{2+}$, $Se^{2+}$, $Mn^{2+}$, $Sn^{2+}$, $Te^{2+}$, $Mo^{2+}$, $Ru^{2+}$, $Rh^{2+}$, $Rb^{2+}$, $W^{2+}$, $Re^{2+}$, $Os^{2+}$, $Ir^{2+}$ and $Pt^{2+}$. Typically, the one or more metal tetracations $[M^{IV}]$ are selected from $Pd^{4+}$, $Pb^{4+}$, $Ge^{4+}$, $Se^{4+}$, $Mn^{4+}$, $Sn^{4+}$, $Te^{4+}$, $Mo^{4+}$, $Ru^{4+}$, $Rh^{4+}$, $Rb^{4+}$, $W^{4+}$, $Re^{4+}$, $Os^{4+}$, $Ir^{4+}$ and $Pt^{4+}$.

Often, the one or more metal dications $[M^{II}]$ comprise $Pd^{2+}$; and the one or more metal tetracations $[M^{IV}]$ comprise $Pd^{4+}$. In this case, the process typically produces a hexahalopalladate.

In some cases, the one or more metal dications $[M^{II}]$ comprise $Sn^{2+}$; and the one or more metal tetracations $[M^{IV}]$ comprise $Sn^{4+}$.

The one or more halide anions [X] are typically selected from $Br^-$, $Cl^-$ and $I^-$. Often, [X] comprises $Br^-$ or $Cl^-$.

The halometallate compound of formula (IV) may be as defined herein for the halometallate compound of formula (II). Typically, the halometallate compound of formula (IV) is selected from the group consisting of $Cs_2PdBr_6$, $Cs_2PdCl_6$ and $Cs_2PdI_6$. Preferably, the halometallate compound of formula (IV) is $Cs_2PdBr_6$.

In some cases, the compound may be tin-based. The halometallate compound of formula (IV) may therefore be selected from the group consisting of $Cs_2SnBr_6$, $Cs_2SnCl_6$ and $Cs_2SnI_6$. For instance, the halometallate compound may be $Cs_2SnI_6$.

The compound of formula H[X] is typically selected from HBr, HCl and HI. For instance, the compound of formula H[X] may be HBr.

The compound of formula $[M^{II}][X]_2$ is typically selected from $PdBr_2$, $PdCl_2$, $PdI_2$, $SnBr_2$, $SnCl_2$ and $SnI_2$. Often, the compound of formula $[M^{II}][X]_2$ is selected from $PdBr_2$, $PdCl_2$ and $PdI_2$.

A compound comprising a sulfoxide group is a compound comprising the group >S=O, which may also be represented as $>S^+-O^-$. The compound comprising a sulfoxide group is typically a compound of formula $R_2S=O$, wherein each R group is independently a substituted or unsubstituted $C_{1-20}$ alkyl group or a substituted or unsubstituted aryl group, and wherein the two R groups are optionally joined together to form a ring. Typically, each R group is independently an unsubstituted $C_{1-8}$ alkyl group or an unsubstituted aryl group Each R is typically selected from methyl, ethyl, n-propyl, isopropyl, n-butyl, sec-butyl, isobutyl, phenyl and p-tolyl.

Examples of compounds comprising sulfoxide groups include dimethylsulfoxide, ethyl methylsulfoxide, diethylsulfoxide, phenyl methylsulfoxide and diphenysulfoxide.

Typically, the compound comprising a sulfoxide group is dimethylsulfoxide.

Often: the compound of formula [A][X] is CsBr, CsCl or CsI; the compound of formula $[M^{II}][X]_2$ is selected from $PdBr_2$, $PdCl_2$, $PdI_2$, $SnBr_2$, $SnCl_2$ and $SnI_2$; H[X] is HBr, HCl or HI; and the compound comprising a sulfoxide group is dimethylsulfoxide, ethyl methylsulfoxide or diethylsulfoxide.

Typically, the process comprises: (a) dissolving the compound of formula [A][X] and the compound of formula $[M^{II}][X]_2$ in an aqueous solution of H[X] to form a solution; and (b) adding to the solution the compound comprising a sulfoxide group.

In the process according to the invention, the amount of the compound of formula [A][X] is typically from 0.5 to 3.0 equivalents of the amount of the compound of formula $[M^{II}][X]_2$ for instance from 1.5 to 2.5 equivalents. The amount of the compound of formula H[X] is typically from 0.5 to 10.0 equivalents of the amount of the compound of formula $[M^{II}][X]_2$ for instance from 1.5 to 2.5 equivalents.

The reaction temperature is typically from 20 to 100° C., for instance from 50 to 90° C.

The invention also provides a process for producing a layer comprising a semiconducting material, wherein the semiconducting material comprises a halometallate compound comprising: (a) cesium; (b) palladium; and (c) one or more halide anions [X], which process comprises disposing on a substrate a composition comprising the halometallate compound and a solvent. The solvent is then typically removed, for instance by heating.

The halometallate compound may be as defined herein. The solvent may be polar or non-polar. The solvent is typically a polar solvent. Typically, the solvent comprises water, an alcohol (such as methanol or ethanol), dichlormethane, acetonitrile, DMSO or dimethylformamide (DMF). Often, the solvent comprises DMF.

The composition comprising the halometallate compound and a solvent may be formed simply by dissolving the halometallate compound in the solvent. Alternatively, the composition comprising the halometallate compound and a solvent may be formed by combining in a solvent a compound of formula [A][X], a compound of formula $[M^{II}][X]_2$, a compound of formula H[X] and the compound comprising a sulfoxide group.

The composition comprising the halometallate compound and a solvent is typically disposed on the substrate by spin-coating. The composition may alternatively be disposed on the substrate by screen printing or vapour deposition.

The invention also provides a process for producing a semiconductor device, which process comprises (a) a process for producing a layer comprising a semiconducting material as defined herein or (b) a process for producing a halometallate compound as defined herein.

The halometallate compounds of the invention may also be produced by a process which comprises contacting: (i) a compound of formula Cs[Y]; with (ii) a compound of formula Pd[Y]$_2$, wherein [Y] comprises one or more anions selected from acetate, formate, propionate and halide anions. For instance, the process may comprise contacting Pd(Ac)$_2$ and CsAc. The cesium and palladium components may be contacted in a solvent, for instance toluene.

Typically, the two components are contacted in the presence of one or more compounds selected from oleic acid, octadecene and oleylammonium bromide.

The invention will be described further by the following Examples.

EXAMPLES

Example 1—Synthesis and Analysis of Cs$_2$PdBr$_6$ and Cs$_2$PdBr$_4$

General Experimental

Synthesis of Palladium Materials

Cs$_2$PdBr$_6$ single crystals were prepared by sequential reaction processes in aqueous HBr solution. 2M CsBr (Aldrich: 99.999%) and 1M PdBr (Aldrich: 99%) were dissolved in 5 mL aqueous HBr (Aldrich: 48 wt. % in H2O, ≥99.99%) solution in box oven at 85° C. for 5 min. When precursors were completely dissolved to form a clear solution in HBr, 10 vol % of dimethyl sulfoxide (DMSO, Aldrich; anhydrous, ≥99.9%) for HBr was added into the hot precursor solution at 120° C. on the hot plate. Immediately, a precipitate of black Cs$_2$PdBr$_6$ crystals was formed by the adding DMSO in the solution. The solution was cooled down to the room temperature. The crystals were washed with toluene and water for a few times. The crystals were dried on the hot plate under the fume hood at 60° C. for 15-20 min, and then were additionally dried in the box oven at 100° C. overnight. Cs$_2$PdBr$_4$ single crystals were formed by a similar route to Cs$_2$PdBr$_6$ crystals, except that the synthesis was carried out in the absence of DMSO.

Thin-Film Preparation

A precursor solution for the fabrication on Cs$_2$PdBr$_6$ thin film was prepared from the solution obtained by dissolving single crystals in DMF. To dissolve the single crystals, the solution was kept on the hot plate at 150° C. for 5 min. ITO-coated glass substrate and simple glass substrate were washed with 2% Hellmanex in water, deionized water, and iso-propanol in sonication bath for 10 min with each solvent. The last traces of organic residues were removed by oxygen plasma cleaning for 10 min. The substrates were heated at 120° C. on the hot plate to make a uniform film. The solution was coated onto ITO substrate for J-V measurement and the glass substrate for photo-physical measurement by a spin-coating process at 2000 rpm for 45 seconds under low humidity (15-20% relative humidity at 20° C.) condition with a dry compressed air purge in a dry box. The dried films were annealed at 150° C. for 15 min in the dry box. The final thickness of the films was approximately 800 nm. Finally, 100 nm of Ag metal contact layer was deposited on the Cs$_2$PdBr$_6$ film as the counter electrode by thermal evaporation for J-V measurement.

Characterization

Single crystal data were collected for each palladium compound at room temperature using an Agilent Supernova diffractometer that uses Mo Kα beam with λ=71.073 pm, which is equipped with an Atlas detector. Data integration and cell refinement were performed using CrysAlis Pro Software by Agilent Technogies Ltd, Yarnton, Oxfordshire, England. The crystal structure of palladate materials was analysed by Patterson and Direct methods and refined using SHELXL 2014 software package. Powder X-ray reflection diffraction (PXRD) patterns were obtained a Panalytical X'pert powder diffractometer (Cu-Kα1 radiation; λ=154.05 pm) at room temperature. Structural parameters of the polycrystalline samples were obtained by Rietveld refinement using General Structural Analysis Software. An optical microscope (OM; Nikon) and a scanning electron microscope (SEM; Hitachi, S-4300) were used to characterise the morphology of single crystal and film, respectively.

UV-vis absorption spectra were measured by a commercial spectrophotometer (Varian Cary 300 UV-Vis, USA). For single crystal powders, the optical measurement sample was prepared on a KBr matrix to form a pellet. Steady-state PL measurement was carried out with an automated spectrofluorometer (Fluorolog, Horiba Jobin-Yvon), with a 450 W Xenon lamp excitation source and a photomultiplier tube detector. The excitation wavelength was 500 nm. All spectra were corrected for instrumental response using a calibration lamp of known emissivity. Time-resolved PL measurement was obtained with Fluorescence Lifetime Spectrometer (Fluo Time 300, PicoQuant FmbH). Cs$_2$PdBr$_6$ was exited using a 507 nm laser pulsed at frequencies between 20 MHz.

Ultraviolet photoemission spectroscopy (UPS) measurements were carried out using a custom multichamber ultrahigh vacuum (UHV) system with a base pressure of ~1×10$^{-10}$ mbar. UPS spectra were recorded using a SPECS PHOIBOS 100 hemispherical electron energy analyzer with excitation at 21.21 eV from a He I plasma source.

The current-voltage (J-V) measurements were measured (2400 series sourcemeter, Keithley Instruments) under both dark and simulated solar light (AAB ABET technologies Sun 2000 solar simulator) with its light intensity, 100 mW cm$^{-2}$ (AM 1.5). The simulated light was calibrated against a standard amorphous-silicon PV cell (NREL-calibrated KG5 filtered silicon reference cell). The mismatch factor was estimated to be M=1.035405 and the lamp intensity changes to account for this mismatch. The J-V curves were measured between 3V to −3V. The cell aperture area of light incidence was set to 0.0913 cm$^2$ photoactive area by employing an opaque mask.

Sample for the surface photo voltage (SPV) measurement was prepared by putting powders of Cs$_2$PdBr$_6$ on sticky carbon tape placed on an ITO/Glass substrate. A kelvin probe set up (KP technology) was used to measure the surface potential, a supercontinuum white light source (NKT Super compact) was used as a light source and a monochromator (Princeton instrument, SP-2150) to produce monochromatic light. The measurements were done in ambient condition.

Electronic Structure Calculations

All electronic structure calculations were performed using the generalized gradient approximation (GGA) to density functional theory (DFT) as implemented in the Quantum Espresso distribution. The norm-conserving, scalar-relativistic, Hamann pseudopotentials were used in the SG15 library of Schlipf and Gygi. The calculation of the ground state charge density was performed using a plane-wave cutoff of 50 Ry and a 12×12×12, Γ-centered Brillouin-zone grid. For the calculation of the projected density of states we use a fine mesh of 16×16×16 k-point grid. The isotropic effective masses around the valence and conduction band edges were calculated using a uniform mesh of 200×200×200 k-points centered at the X or Γ-point. Hybrid functional calculations were performed using the HSE06 functional, as implemented in Quantum Espresso. A Γ-centered 4×4×4 mesh (8 irreducible k-points) was used for both the k-and q-point grids used to calculate the GGA charge density and the exact exchange, respectively. A calculation using a 5×5×5 grid (10 irreducible k-points) changes the band gap at Γ by less than 5 meV. The difference between the hybrid functional band gap and the GGA band gap is almost uniform (within 0.1 eV) throughout the Brillouin zone, therefore it is appropriate to approximate the HSE band structure as a scissor corrected DFT band structure. Similar calculations were also performed using the PBE0 functional and found that the band gap is overestimated by 0.7 eV. The optical absorption was calculated using the Quantum Espresso code. The optical absorption spectrum was calculated using a 100×100×100 k-point mesh centered at Γ (corresponding to 22776 irreducible k-points), 10 empty states in the conduction band and a broadening of 1 meV.

Moisture Stability Test

The $Cs_2PdBr_6$ single-crystals were immersed into Distilled water for 10 min at room temperature (25° C.). The morphology of the single crystals was obtained by optical microscope. The powder XRD patterns before and after the test were measured by a Panalytical X'pert powder diffractometer (Cu-Kα1 radiation; λ=154.05 pm) at room temperature.

Results and Discussion

To prepare $Cs_2PdBr_6$ single crystals, 2M CsBr and 1M PdBr2 was dissolved in 5 mL aqueous HBr (48 wt. % in $H_2O$) solution and placed the solution in a box furnace at 85° C. for 5 min. We then added 10 vol % of dimethyl sulfoxide (DMSO) into the hot precursor solution kept at 120° C. on the hot plate. Immediately, black $Cs_2PdBr_6$ crystals precipitated from the solution and were collected. The detailed description is given above under the general experimental procedures section.

Structure and Formation of $Cs_2PdBr_6$

The optical microscope (OM) image of a black lustrous octahedral shaped crystal of $Cs_2PdBr_6$ (lateral size of 30 μm) is shown in FIG. 1a. A sharp Bragg peaks (see FIG. 2) is observed with the selection rules characteristic of Fm$\bar{3}$m symmetry revealing absences [hkl; h+k, k+l, (h+l=2n)] corresponding to face-centered space groups F432, F$\bar{4}$3m and Fm$\bar{3}$m. It is found that the crystallographic data is consistent with the space group Fm$\bar{3}$m (no. 225). The details of the crystallographic refinements are summarised in Table 1.

TABLE 1

Crystallographic Data for a $Cs_2PdBr_6$ single crystal.

| | |
|---|---|
| Compound | $Cs_2PdBr_6$ |
| Measurement temperature | 293 K |
| Crystal system | Cubic |
| Space group | Fm$\bar{3}$m (no. 225) |
| Unit cell dimensions | a = 10.6212 ± 0.0017 Å, α = β = γ = 90° |

TABLE 1-continued

Crystallographic Data for a $Cs_2PdBr_6$ single crystal.

| | |
|---|---|
| Volume | 1198.18 Å$^3$ |
| Z | 4 |
| Density (calculated) | 4.721 g/cm$^3$ |
| Absorption coefficient | 26.365 mm$^{-1}$ |
| Reflections collected | 2687 |
| Unique reflections | 80 from which 0 suppressed |
| R(int) | 0.26 |
| R (sigma) | 0.0669 |
| Goodness-of-fit | 1.255 |
| Final R indices ($R_{all}$) | 0.0435 |
| $wR_{obs}$ | 0.1154 |
| Wavelength | 0.71073 Å |
| Weight scheme for the refinement | Weight = 1/[1 sigma$^2$(Fo$^2$) + (0.0000 * P)$^2$ + 60.00 * P] where P = (Max (Fo$^2$, 0) + 2 * Fc$^2$)/3 |

| | Atom | Site | x | y | z | Occ* |
|---|---|---|---|---|---|---|
| Atomic Wyckoff-positions | Cs | 8c | 0.25 | 0.25 | 0.25 | 1 |
| | Pd | 4a | 0 | 0 | 0 | 1 |
| | Br | 24e | 0.2340 | 0 | 0 | 1 |

| | |
|---|---|
| Isotropic temperature factors (Å$^2$) | $U_{iso}$ (Cs) 0.03353 ± 0.00136, (Pd) 0.02463 ± 0.00175, (Br) 0.03173 ± 0.00122 |
| Anisotropic temperature factor (Å$^2$) | $U_{11}$ (Cs) = 0.03353 ± 0.00136, $U_{11}$ (Pd) = 0.02463 ± 0.00175, $U_{11}$ (Br) = 0.02391 ± 0.00177, $U_{22}$ (Cs) = 0.03353 ± 0.00136, $U_{22}$ (Pd) = 0.02463 ± 0.00175, $U_{22}$ (Br) = 0.03565 ± 0.00139, $U_{33}$ (Cs) = 0.03353 ± 0.00136, $U_{33}$ (Pd) = 0.02463 ± 0.00175, $U_{33}$ (Br) = 0.03565 ± 0.00139 |

Figure 3B:
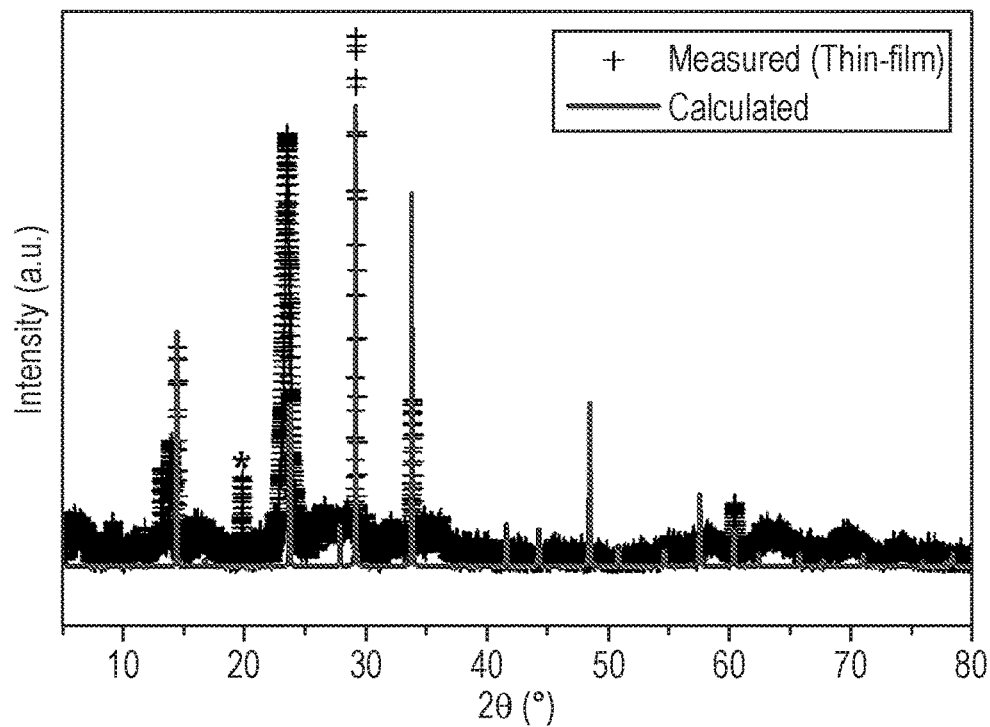

Using the crystallographic data, the unit cell has been simulated as shown in FIG. 1b. The phase purity and the crystal structure of the polycrystalline sample of $Cs_2PdBr_6$ (i.e. powder and thin-film) is confirmed by powder X-ray diffraction (PXRD) as shown in FIG. 3. The measured PXRD patterns are in a good agreement with the calculated single crystal data.

Figure 4:
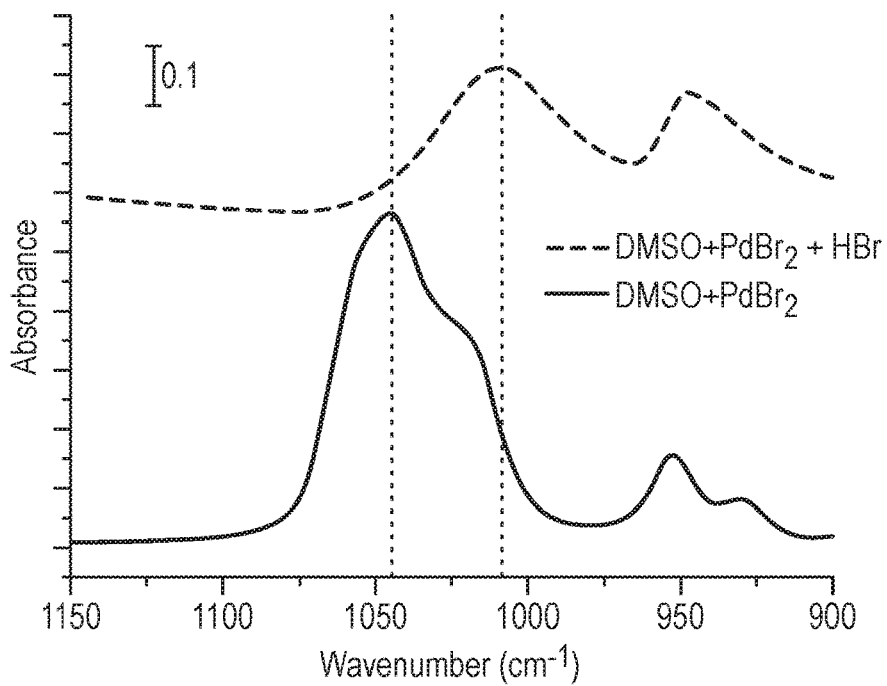
FIG. 4 shows attenuated total reflection infrared (ATR-IR) spectroscopy of $PdBr_2$ solution in DMSO and after the addition of HBr to the solution.
Figure 5:
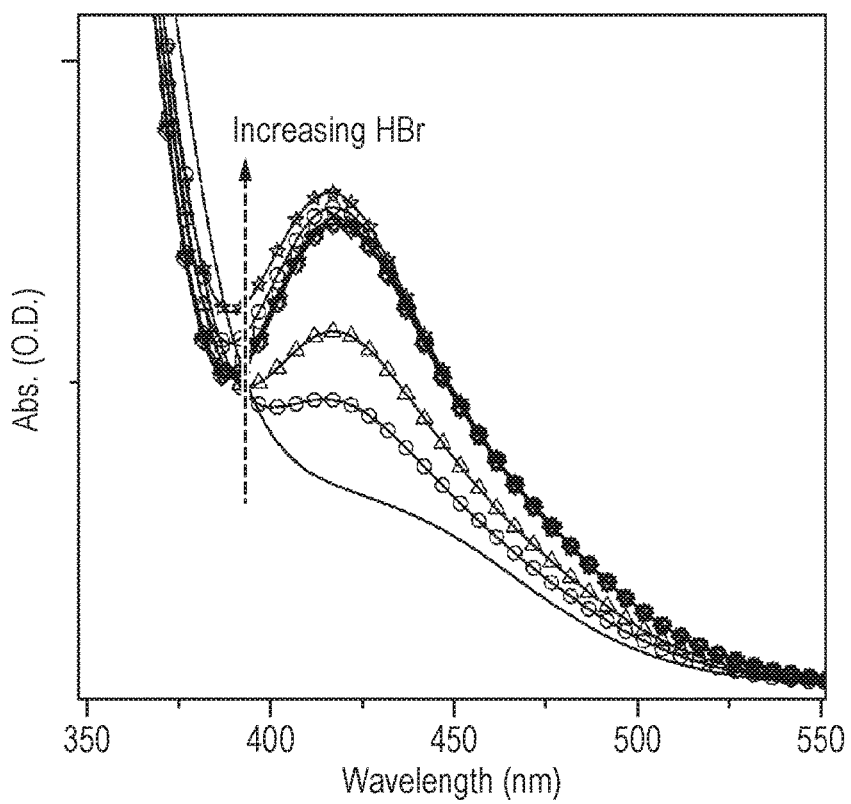
FIG. 5 shows UV-Vis absorption spectrum of $PdBr_2$ in DMSO as a function of added HBr.

The formation mechanism of $Cs_2PdBr_6$ is proposed as follows. In the starting solution, PdBr$_2$ is used where Pd is in its 2+ oxidation state. However, from the XRD measurements and crystallographic refinement of $Cs_2PdBr_6$, the structure is only consistent with Pd in the 4+ oxidation state. As no external oxidizing agent is added to the solution, the oxidizing agent must have been generated in-situ. Changes in the salt solution are monitored using attenuated total reflection infrared (ATR-IR) spectroscopy. FIG. 4 shows the IR spectrum of PdBr$_2$ solution in DMSO and after the addition of HBr to the solution. It is seen that the absorbance peak around 1045 cm$^{-1}$ that corresponds to absorbance of S=O bond shifts to 1008 cm$^{-1}$ after the addition of HBr. This shift of absorbance peak to a lower energy indicates that the bond order of S—O bond in DMSO changes due to the formation of DMSO-HBr adduct. HBr: DMSO is known to function as the oxidizing agent in organic synthesis, as well as oxidization of metals (Karki et al, J. Org. Chem. 2015, 80 (7), 3701). Here, HBr: DMSO oxidizes Pd$^{2+}$ to Pd$^{4+}$ and the available bromide ions in HBr: DMSO lead to the formation of [PdBr$_6$]$^{-2}$, which is then the building block to form the compound with Cs$^+$ as the counter ion. The oxidation of Pd (II) and formation of a new complex are often associated with a change in the absorbance spectrum. Monitoring the change in the UV-Vis absorption spectrum of PdBr$_2$ in DMSO as a function of added HBr (see FIG. 5) it is observed that the absorbance around 415 nm increases with the addition of HBr. For a control system without the PdBr$_2$ salt, no change is seen in the UV-Vis spectrum.

Figure 6:
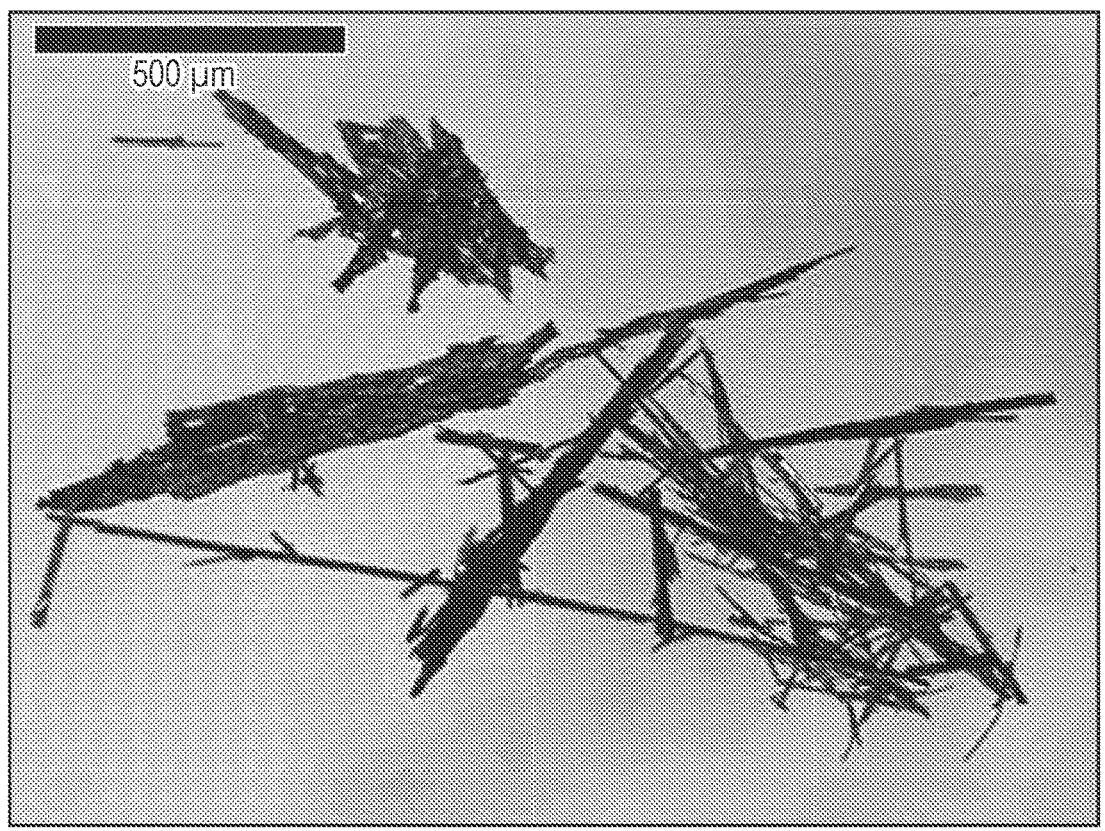
FIG. 6 shows optical microscope images of $Cs_2PdBr_4 \cdot xH_2O$ crystals
Figure 7:
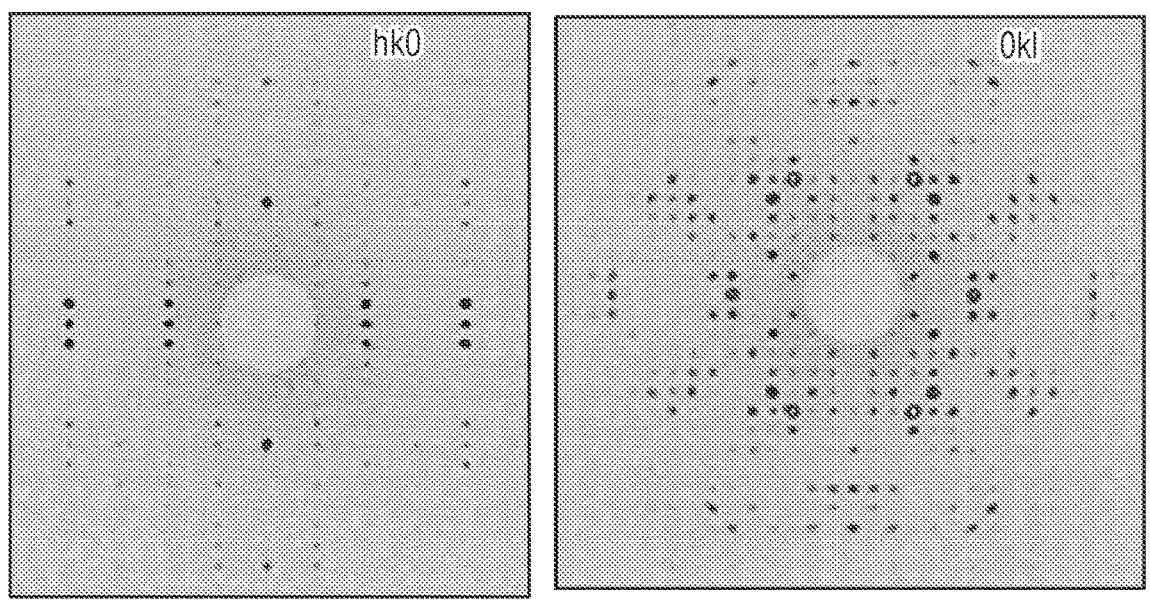
FIG. 7 shows the X-ray diffraction patterns of $Cs_2PdBr_4 \cdot xH_2O$ to two different plains.

To find out if HBr: DMSO system is essential for the formation of Cs$_2$PdBr$_6$, a single crystal study was performed with a single-crystal fabricated from CsBr:PdBr$_2$ (2:1) in HBr (i.e. without DMSO). FIG. 6 shows the optical microscopy image of single-crystals from the above-mentioned solution which are reddish needle-like crystals, in contrast to the Cs$_2$PdBr$_6$, which forms as octahedral shaped crystals. The single crystal XRD analysis shows sharp Bragg peaks in 2/m Laue class and further analysis confirms the space group P2$_1$/c and the chemical composition of Cs$_2$PdBr$_4$.xH$_2$O. In the latter composition, Pd$^{2+}$ is in a square planar coordination (see Table 2 and FIG. 7). These results help us understand the role of HBr: DMSO in formation of Cs$_2$PdBr$_6$.

TABLE S2

Crystallographic data from Rietveld refinement of Cs$_2$PdBr$_4$ · xH$_2$O PXRD.

| | |
|---|---|
| Compound | Cs$_2$PdBr$_4$ · xH$_2$O |
| Measurement temperature | 293 K |
| Crystal system | Monoclinic |
| Space group | P2$_1$/c |
| Unit cell dimensions | a = 7.566(4) Å, b = 18.728(1) Å, and c = 19.349(9) Å α = γ = 90°, β= 92.5° |
| Volume | 2741.906 Å$^3$ |

Electronic Band Structure Calculation

In order to investigate the optoelectronic properties of Cs$_2$PdBr$_6$, the electronic band structure is calculated within the generalized gradient approximation to density functional theory (DFT/GGA) and correct the underestimated band gap using the Heyd-Scuseria-Ernzerhof (HSE) hybrid functional. As shown in Table 3 and FIGS. 8a and 8b, an indirect fundamental bandgap between Γ (valence band top) and X (conduction band bottom) of 1.56 eV was obtained from DFT-HSE. However, from FIG. 8a it is also noted that the lowest direct band gap (at the X-point) is only marginally larger than the indirect band gap (1.59 eV). In addition, the isotropic electron and hole effective masses at the X and Γ points respectively was also calculated within DFT/PBE (Table 3) as described in the full details of the electronic structure calculation below.

TABLE 3

DFT/PBE effective masses calculated within DFT/PBE, band gaps calculated within DFT/PBE and HSE and optical band gap measured from the photoluminescence spectrum of Cs$_2$PdBr$_6$.

| Compound | Hole effective mass (m$_h$*) | Electron effective mass (m$_e$*) | Band gap (eV) (PBE) | Band gap (eV) (HSE) |
|---|---|---|---|---|
| Cs$_2$PdBr$_6$ | 19.9 (h)/0.85 (l) | 0.53 | 0.65 | 1.56 |

Figure 8:
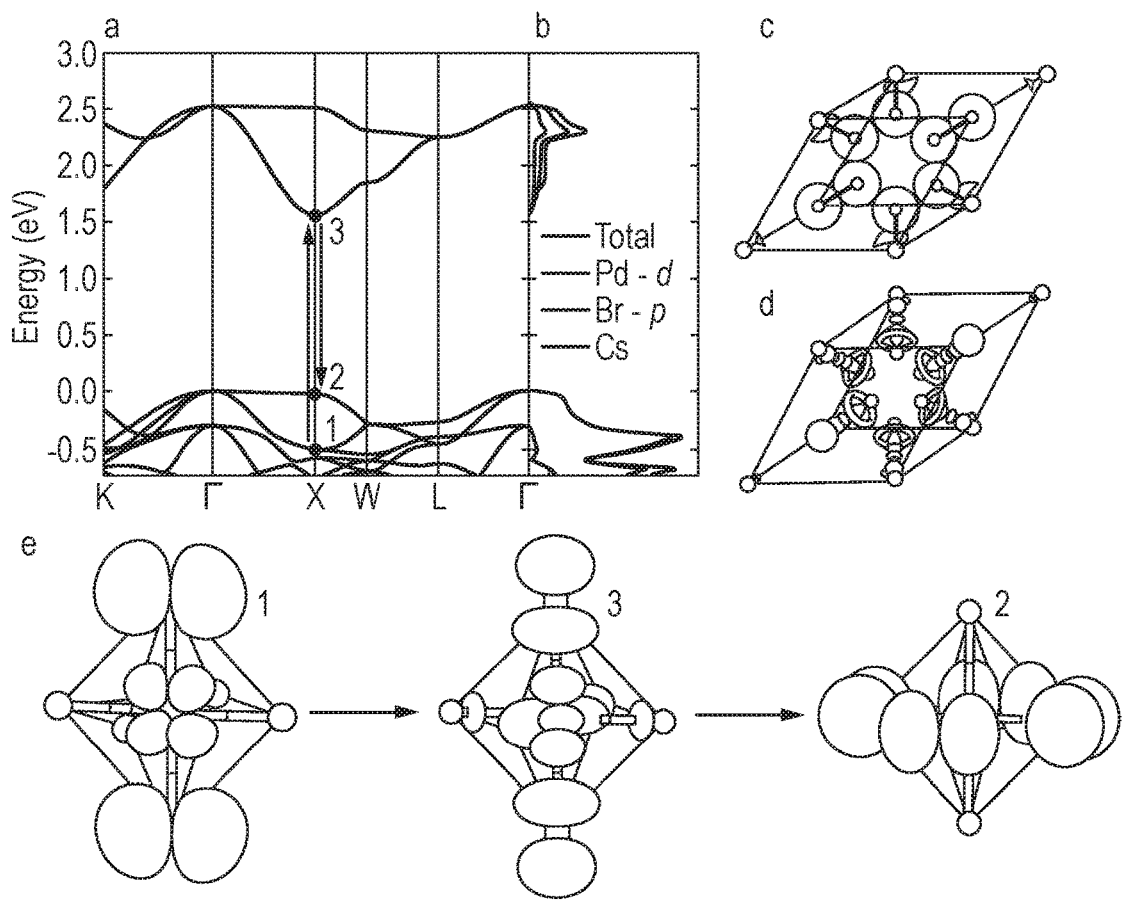
FIG. 8 shows: (a) calculated electronic band structure of $Cs_2PdBr_6$ on the high symmetry path: K ($3\pi/2a$, $3\pi/2a$, 0)–Γ(0,0,0)–X (0, $2\pi/a$, 0)–W ($\pi/a$, $2\pi/a$, 0)–L ($\pi/a$, $\pi/a$, $\pi/a$)–Γ, where (a/2, 0, a/2), (a/2, a/2, 0) and (0, a/2, a/2) are the lattice vectors of the FCC lattice. The black dots mark the second highest (1) and highest (2) occupied state and the lowest unoccupied state (3) at the X-point. The arrows mark the 1-3 and 2-3 optical transitions. (b) Projected density of states. (c) 3D plot of the total charge density and (d) the bonding charge density. (e) 3D plot of the wave-function distribution at the points marked (1), (2) and (3) on the band structure in (a).
Figure 9:
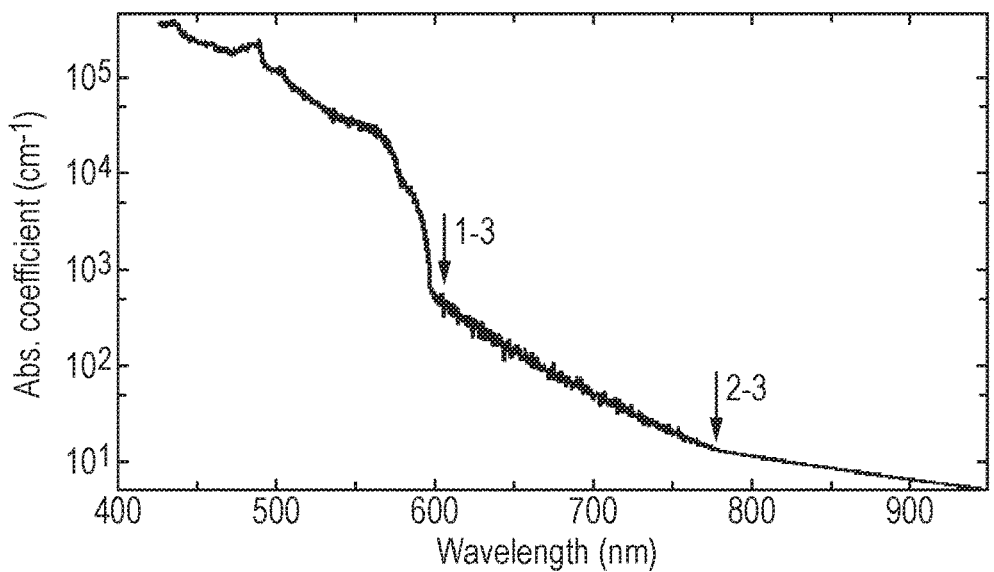
FIG. 9 shows independent particle optical absorption spectrum of $Cs_2PdBr_6$ calculated within DFT/PBE and blue-shifted by the HSE correction of 0.9 eV (the axis corresponding to the absorption coefficient is in a logarithmic scale).

The electrons have a smaller effective mass to the light holes (0.53 vs 0.85 m$_e$, respectively), while the heavy hole effective masses are two orders of magnitude larger (19.9 m$_e$). Owing to the presence of the heavy hole band at the top of the valence band, and the low electron effective masses, it is expected that Cs$_2$PdBr$_6$ will behave as an n-type semiconductor, with a higher electron mobility to hole mobility. In FIGS. 8c and 8d, the total charge density distribution calculated within DFT/GGA and the charge density of the non-interacting atoms placed at the crystallographic sites (bonding charge density) is shown. FIG. 8c shows that the electrons are either localized in the PdBr$_6$ octahedra or on the Cs cation, in a close resemblance to CH$_3$NH$_3$PbI$_3$. In FIG. 8d, it is confirmed that the non-bonding character of the electrons localized on Cs. Additionally, this calculation displays a redistribution of the electrons primarily around the Br$^-$ ions directed towards the interstitial space between the isolated octahedra. This redistribution of charge can explain why the band structure displays such a dispersive profile, despite the absence of the corner-sharing connectivity of the PbBr$_6$ octahedra. In FIG. 9, a calculated independent-particle optical absorption spectrum is shown without taking into account phonon-assisted processes or electron-hole interaction. A sharp increase in the calculated absorption coefficient at 600 nm (2.07 eV) is observed which corresponds to the transitions 1-3 on the band structure in FIG. 8a. The absorption onset at approximately 780 nm (1.59 eV) is observed, which is similar to the direct band gap at the X-point (i.e. the transition 2-3). The difference in the oscillator strengths at these two photon energies can be rationalized qualitatively from the distribution of the electronic wave functions at states 1, 2 and 3 (shown in FIG. 8). As observed in FIG. 8e, the 1-3 optical transition occurs between electronic states localized at the same crystal site, in contrast to the 2-3 transition, which explains the large difference in the strength of the dipole matrix elements. It is noted that the optical transitions are dipole-forbidden right at the X-point, but become allowed as soon as the wave vector is slightly off X.

Optoelectronic Properties of Cs$_2$PdBr$_6$

Figure 10A:
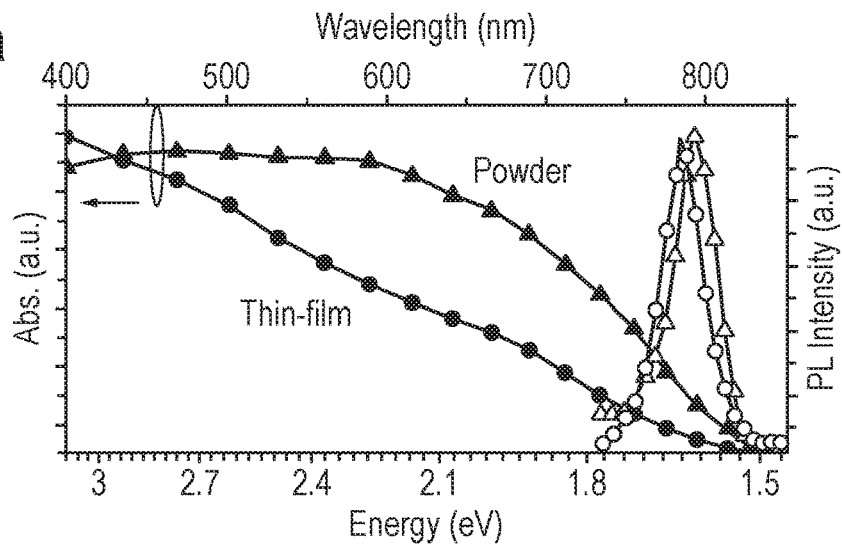
FIG. 10 shows (a) UV-vis absorption, steady-state PL and (b) Time-resolved PL decay of a $Cs_2PdBr_6$. (c) J-V curves on a $ITO/Cs_2PdBr_6/Ag$ junction device under the dark and simulated sun light (100 mW $cm^{-2}$, AM 1.5). The insert in (c) shows photogenerated current density under simulated solar light over time at a fixed voltage at –0.5 V.
Figure 10B:
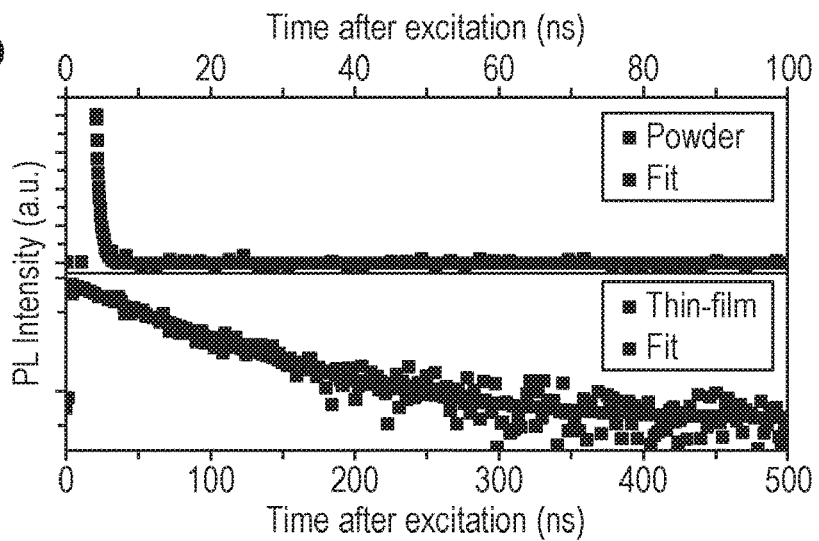
Figure 11:
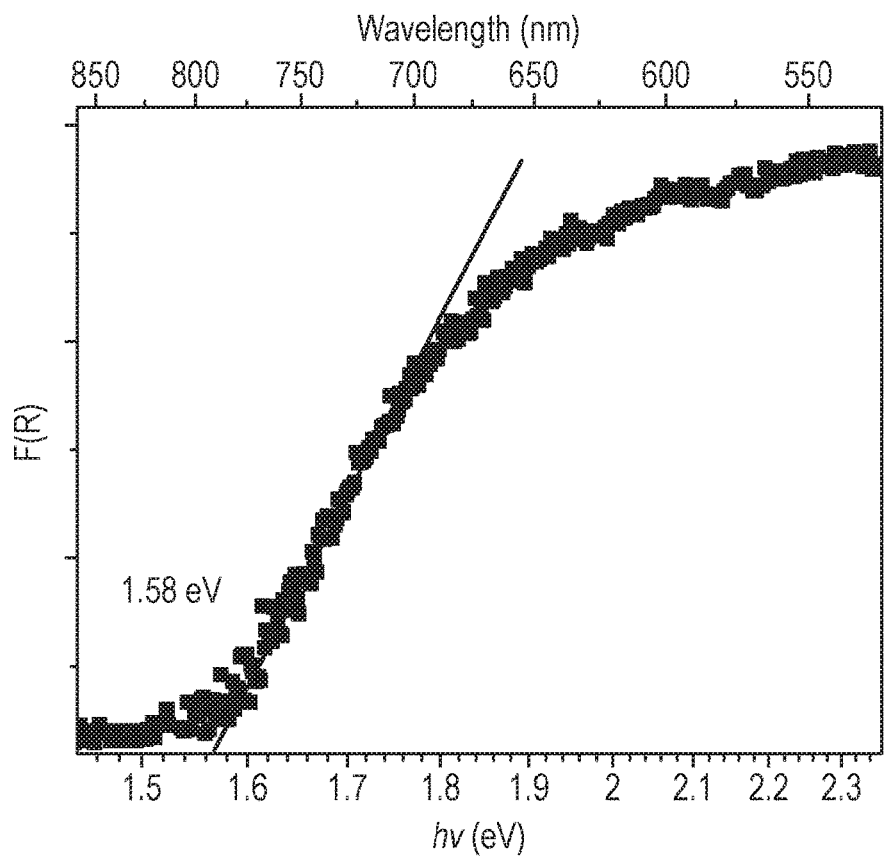
FIG. 11 shows the correlation between photon energy and Kubelka-Munk function F(R) of the $Cs_2PdBr_6$ with KBr matrix.

To investigate experimentally the optoelectronic properties of Cs$_2$PdBr$_6$, UV-visible absorption and steady-state photoluminescence (PL) measurements were performed on the single crystals and thin film as shown in FIG. 10a. The absorption onset on the single crystal appears at ~784 nm (1.58 eV), and the PL spectra show PL emission maximum at 772 nm (1.60 eV), respectively. The absorption onset at 1.58 eV is deduced by Kubelka-Munk function (F(R)) theory as shown in FIG. 11, which shows a correlation between photon energy and F(R) to take into account for the contribution of the scattering from the single crystal sample. The optical spectrum of a thin-film spin-coated from a solution of dissolved single crystals in DMF also shows the optical band gap of ~1.60 eV, in good agreement with the DFT-HSE calculations. From the combined experimental and theoretical analysis of the optoelectronic properties of Cs$_2$PdBr$_6$ it is proposed that light absorption mainly takes place through the higher energy transitions (1-3 in FIGS. 8a and 9) while the electron-hole recombination should be associated with 2-3 transitions at the band edges (shown in FIGS. 8a and 9). In FIG. 10b, we show a time resolved photoluminescence (TRPL) decay of a single crystal and a thin film. The early decay fitted by a mono-exponential function with decay times of 1.85 ns and 79 ns, respectively. This long lifetime and direct band-to-band transition from Cs$_2$PdBr$_6$ are very encouraging indicators for applications in optoelectronic devices.

Figure 12:
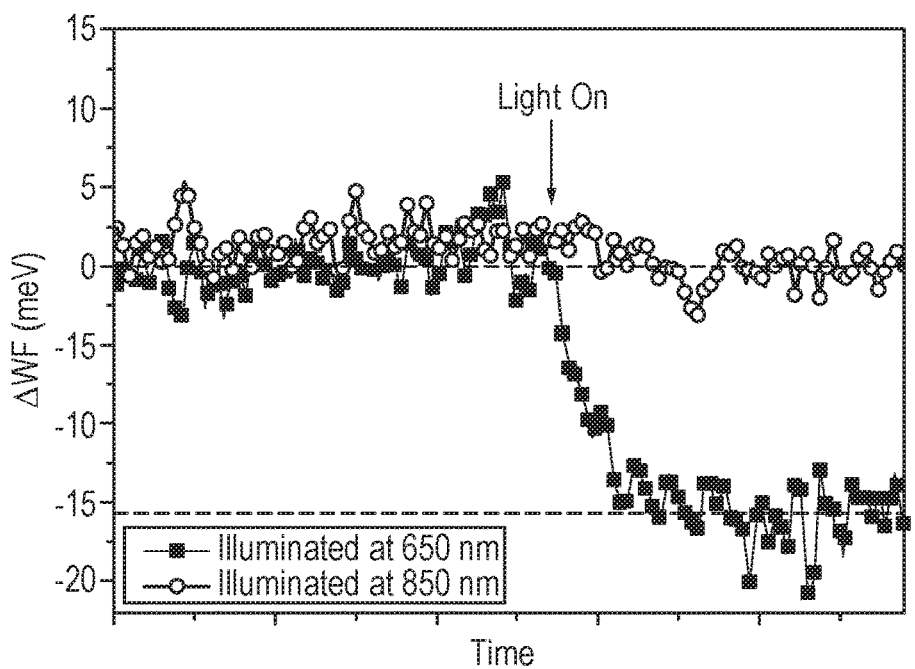
FIG. 12 shows the change in surface potential of $Cs_2PdBr_6$ powder on illumination as measured by a kelvin probe. A decrease in work-function happens only by the supra bandgap illumination (650 nm) indicating an insignificant amount of band-gap states in the material.
Figure 13A:
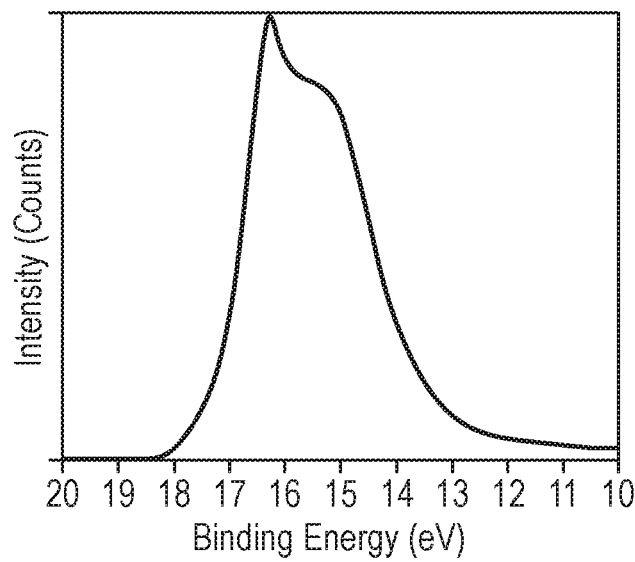
FIG. 13 shows ultraviolet photoemission spectroscopy (UPS) measurements showing the (a) secondary electron cut-off (SECO) and (b) valence band structure in $Cs_2PdBr_6$. Band energy diagram (c) assumes an electronic band gap equal to the optical band gap of 1.6 eV.
Figure 13B:
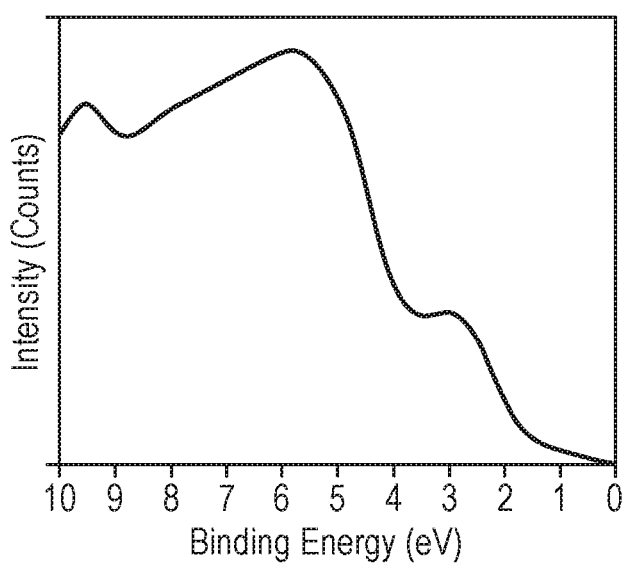
Figure 13C:
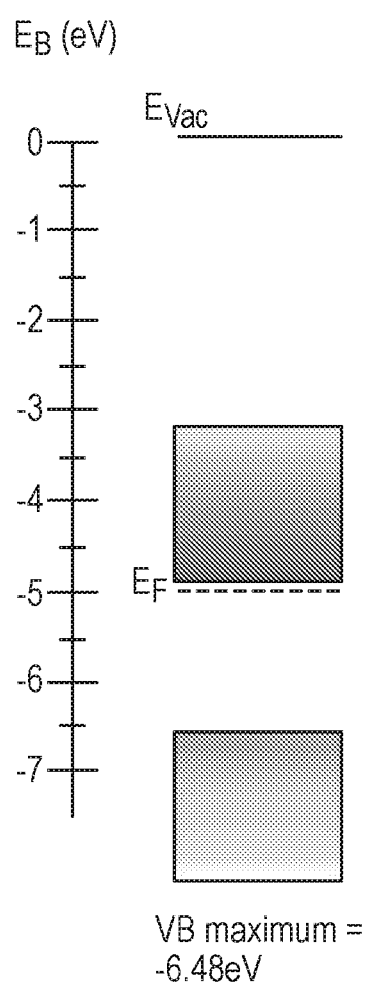

To find out whether Cs$_2$PdBr$_6$ has significant amount of density of states in the bandgap, a surface photo voltage (SPV) study was performed using sub band gap illumination at 850 nm (i.e. 1.46 eV). Presence of electronic states in the bandgap region gives SPV response, however, as shown in the FIG. 12, we do not see any response from sub bandgap illumination confirming that the presence of electronic states in the bandgap region in these material is not very significant. Ultraviolet photoemission spectroscopy (UPS) was used to determine the energetic band levels in Cs$_2$PdBr$_6$ thin films and we show the UPS spectrum in FIG. 13. It is determined that the valence band position is determined from the secondary electron cut-off (SECO) region. The valence band maximum (VBM) of a $Cs_2PdBr_6$ thin film is located at −6.47 eV with respect to the vacuum level, whereas the Fermi level of the material is at −4.95 eV, close to the conduction band minimum of −4.86 eV (calculated by subtracting the optical band gap from the VBM). The Fermi-level position is consistent with an n-type nature of this material, and potentially a shallow donor level existing. The conduction and valence band energy levels are relatively deep, as compared to the archetypical $CH_3NH_3PbI_3$ perovskite.

Figure 10C:
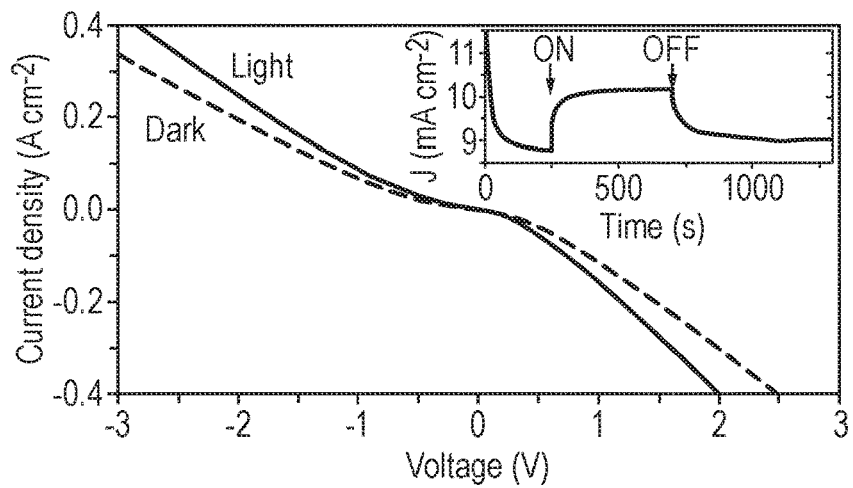
Figure 14:
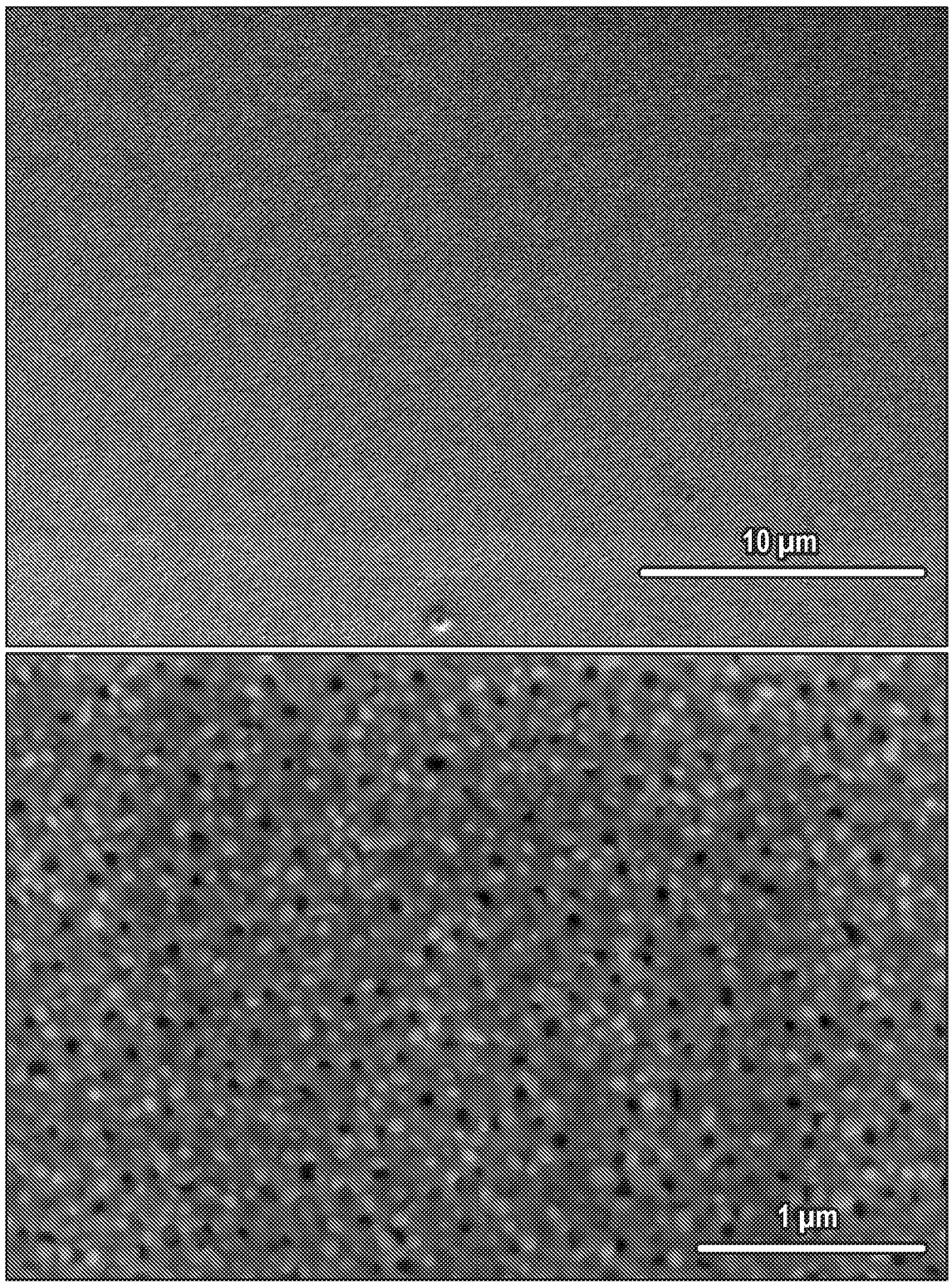
FIG. 14 shows SEM images with different magnification (top: 4 k and bottom: 30 k) of the top surface of the $Cs_2PdBr_6$ thin-film on indium tin oxide substrate.

In order to assess whether $Cs_2PdBr_6$ is photoconductive, a simple "sandwich-structure" device of $ITO/Cs_2PdBr_6/Ag$ junction was fabricated and characterized by current density-voltage (J-V) measurement under ambient conditions, as shown in FIG. 10c. It is found that the $Cs_2PdBr_6$ thin-film on an ITO substrate displays a uniform surface, which is shown in FIG. 14. In FIG. 10c, the J-V characteristics in dark and under AM1.5 simulated solar light at 100 mWcm$^{-2}$ is shown. As an inset of FIG. 10c, we show the transient photo-response of the conductivity of the device, measured at −0.5 V applied bias. An increase in conductivity under illumination is observed. This is consistent with the fact that $Cs_2PdBr_6$ is a semiconductor that shows a photo-responsive behavior. In addition, the 4-point probe conductivity of $Cs_2PbBr_6$ thin films processed on glass was measured and a dark conductivity of 2.5×10$^{-5}$ Scm$^{-1}$ was measured. This is in a similar range to the dark conductivity of doped organic charge collection layers.

Figure 15A:
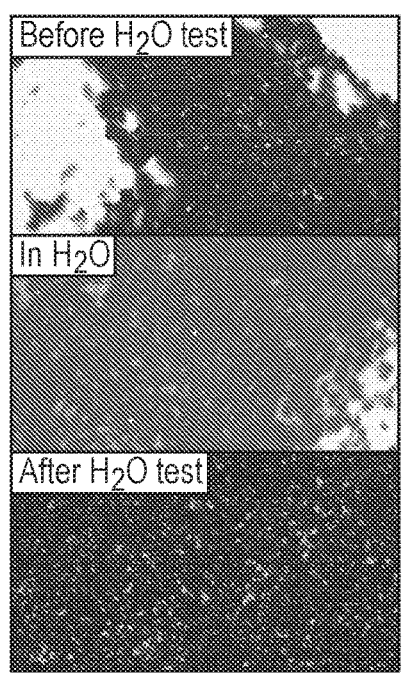
FIG. 15 shows (a) optical microscope images of $Cs_2PdBr_6$ during $H_2O_2O$ stability test. (b) Powder X-ray diffraction pattern of $Cs_2PdBr_6$ powder before and after water immersion test.
Figure 15B:
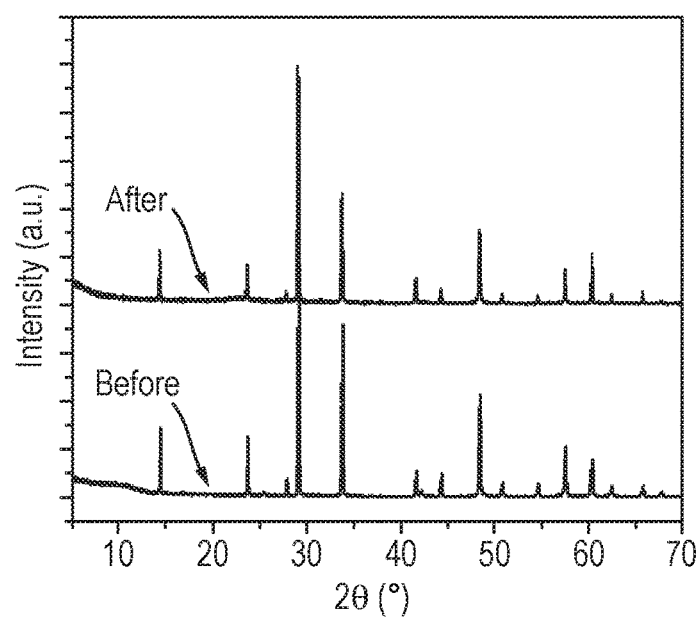

Finally, to examine the chemical and phase stability of $Cs_2PdBr_6$, a water tolerance test was carried out on the $Cs_2PdBr_6$ crystals. $Cs_2PdBr_6$ crystals were put in water at room temperature for 10 min. FIG. 15 shows the comparison of PXRD patterns and optical microscopy images before and after the water immersion test. No obvious differences reminiscent of phase change and chemical decomposition of crystallites were observed after these were immersed in $H_2O$. This clearly shows that $Cs_2PdBr_6$ is a water stable compound.

In summary, the material $Cs_2PdBr_6$ has been produced and confirmed as a promising semiconducting material. The new material may be synthesized from a solution process, enabled by an in-situ oxidization of $Pd^{2+}$ to $Pd^{4+}$ during synthesis. This method has not been considered for the synthesis of palladium-based materials, nor other $A_2MX_6$ compounds. $Cs_2PdBr_6$ crystallizes in a cubic crystal structure with space group $Fm\bar{3}m$. $Cs_2PdBr_6$ shows remarkable structure and chemical stability, unlike Pb-based halide perovskites. Electronic structure calculations within DFT-HSE, as well as optical absorption and PL measurements confirm that this compound has a band gap of 1.6 eV. In addition, the photo-response in an $ITO/Cs_2PdBr_6/Ag$ device indicates that $Cs_2PdBr_6$ can be employed into a wide range optoelectronic applications such as photon-sensors, light-emitting diodes and PV devices.

Full Details of the Electronic Structure Calculation

Figure 16A:
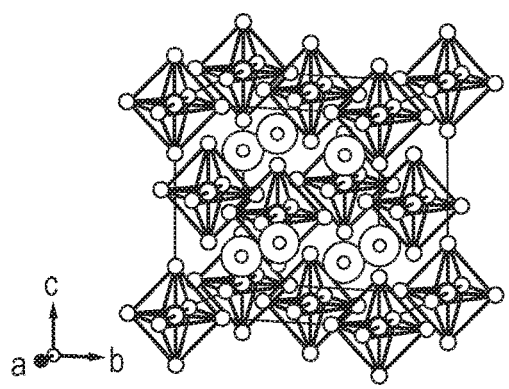
FIG. 16 shows polyhedral model for the crystal structure of the conventional (a) and primitive (b) unit cell of $Cs_2PdBr_6$.
Figure 16B:
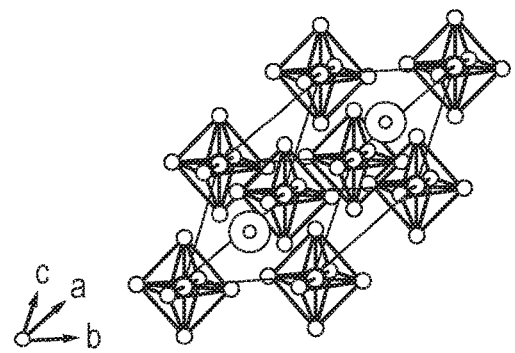

The crystal structure of $Cs_2PdBr_6$ is $Fm\bar{3}m$, as obtained from XRD, with the conventional unit cell depicted in FIG. 16a. The structure is formed by alternating layers of isolated $[PdBr_6]^{-2}$ and $Cs^+$ cations. The conventional unit cell can be reduced to a primitive unit cell, as shown in FIG. 16b, in a similar way to the case of $Cs_2BiAgCl_6$ and $Cs_2BiAgBr_6$. All calculations discussed onwards were obtained using the primitive unit cell.

As shown in FIG. 8a, the conduction band bottom is of a mixed Pd-d/Br-p character, while the valence band bottom is almost exclusively of a Br-p character. An indirect band gap of 0.65 eV was calculated within DFT/GGA, which expectedly underestimates the optical band gap by 1 eV. In order to correct for the band gap underestimation, recalculation of the electronic band gap was done using the hybrid HSE functional. An indirect band gap of 1.56 eV was calculated within HSE as well as a direct band gap at the X-point, only 30 meV above the indirect gap, as shown in FIG. 8a. The direct band gap at X is in very good agreement with the optical band gap of 1.6 eV measured from photoluminescence.

An independent-particle optical absorption spectrum was calculated. A sharp increase in the absorption coefficient was observed in the calculated independent-particle spectrum at 600 nm (2.07 eV) which corresponds to the transitions 1-3 on the band structure in FIG. 8a. This feature matches well the shoulder at 600 nm in the measured optical absorption spectrum. It was found that the absorption onset is at approximately 780 nm (1.59 eV), which is similar to the direct band gap at the X-point.

Example 2—Synthesis and Analysis of $Cs_2PdX_4$, X=Cl, Br and I $Cs_2PdX_4$ (X=Cl, Br and I) crystals were prepared in aqueous HX solution. 2M CsX and 1M PdX were dissolved in 5 mL aqueous HX (Cl: 32 wt % $H_2O$, Br: 48 wt. % in H2O and I: 57 wt % $H_2O$) solution in box oven at 85° C. for 30 min. (Note that the temperature is not an actual solution temperature.) The solution was cooled down to the room temperature after dissolved all solid material into the HX solution. The crystals were washed with diethyl either for a few times. The crystals were dried on the hot plate under the fume hood at 60° C. for 15-20 min, and then it was additionally dried in the box oven at 100° C. overnight.

Optical micrographic images of $Cs_2PdX_4$ crystals were taken, where X=Cl, Br and I. Two-dimensional plate-like crystals of approximately 100 μm size were observed for $Cs_2PdCl_4$.

One-dimensional rod-shaped crystals were observed for $Cs_2PdBr_4$. Three-dimensional crystals were observed for $Cs_2PdI_4$.

Figure 17:
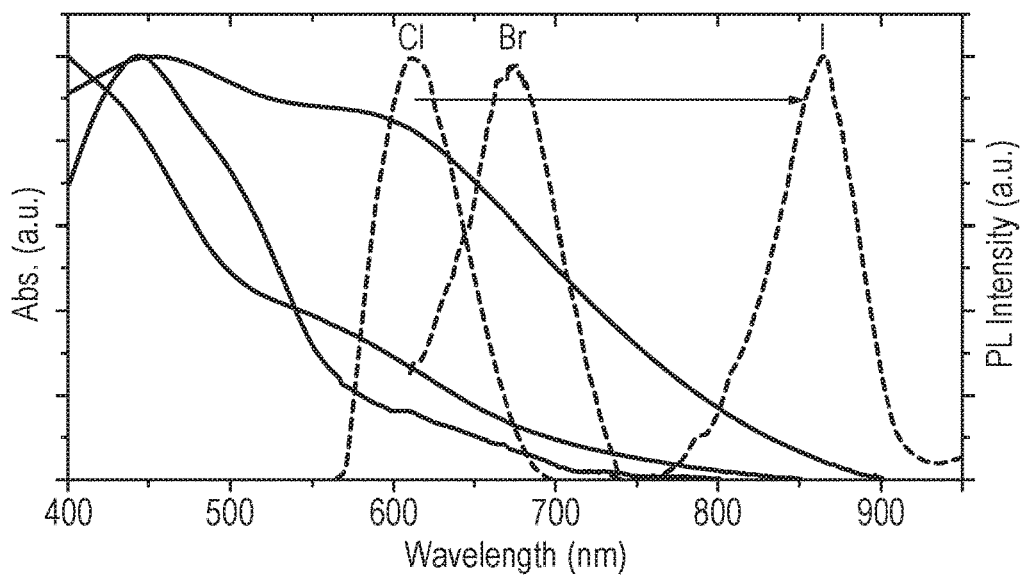
FIG. 17 shows UV-visible absorption and steady-state photoluminescence of $Cs_2PdX_4$ materials, with X=$Cl^-$, $Br^-$ and $I^-$.

To understand the material properties of $Cs_2PdX_4$, the photo-physical properties of those compounds such as UV-visible absorption and steady-state photoluminescence (SSPL) were investigated, as shown in FIG. 17. $Cs_2PdCl_4$ shows an optical absorption onset from 700 nm on UV-visible absorption spectra and a broad photoluminescence peak is observed between 563 to 688 nm with the maximum at 613 nm (~2.02 eV) by SSPL, blue-shifted with respect to the optical absorption onset. The SSPL and absorption of $Cs_2PdBr_4$ and $Cs_2PdI_4$ is also shown.

Example 3—Comparative Stability of $Cs_2PdBr_6$ and $CsPbBr_3$ in Water

Figure 18:
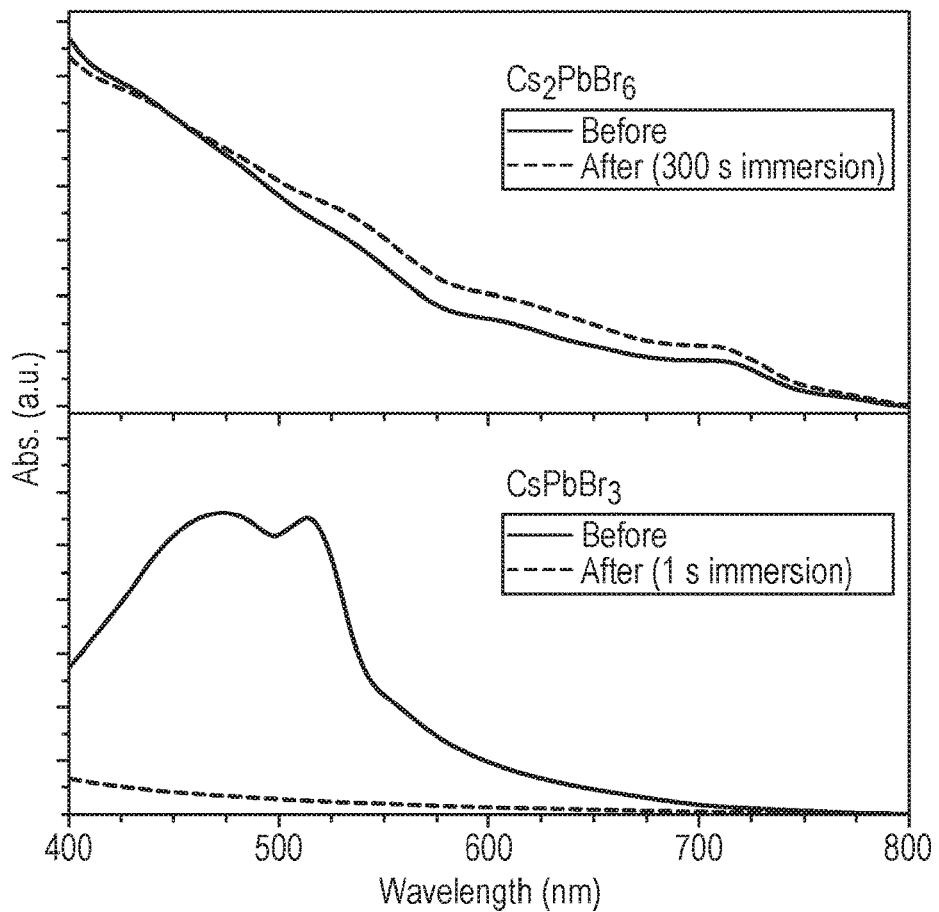
FIG. 18 shows comparative UV-visible absorption spectra of $Cs_2PdBr_6$ and $CsPbBr_3$ before and after immersion in water.

To confirm the improved stability of the cesium halopalladate materials in water compared with known lead-based perovskites, a comparative stability test was carried out. Films of $Cs_2PdBr_6$ and $CsPbBr_3$ were produced on glass by solution processing. These films were then submerged in water. The $Cs_2PdBr_6$ film was submerged for 300 seconds and the $CsPbBr_3$ film was submerged for 1 second. UV-vis spectra of the films were observed before and after submersion for both films. The results are shown in FIG. 18. The absorption for the $CsPbBr_3$ has almost completely disappeared after 1 second submersion indicating that the film is not at all stable in water. In contrast, the $Cs_2PdBr_6$ remains stable even after 300 s in water. This confirms that cesium halopalladate materials are water stable.

Example 4—Mixed Palladium/Lead Material

Experiments were carried out to produce materials comprising cesium, lead, palladium and bromine.

Materials

The following compounds were used in the amounts specified in Table 4 below: octadecene (ODE), oleic acid (OA), lead (II) acetate trihydrate ($Pb(Ac)_2$), cesium acetate (CsAc), palladium acetate ($Pd(Ac)_2$), oleylammonium bromide (OAmBr), toluene (Tol), 1-butanol, n-hexane.

TABLE 4

| Reaction | ODE | OA | $Pb(Ac)_2$ | CsAc | $Pd(Ac)_2$ | OAmBr (0.3 $moldm^{-3}$) |
|---|---|---|---|---|---|---|
| 1 | 8 mL | 2 mL | 0.2 mmol | 0.1 mmol | 0 mmol | 2 mL |
| 2 | 8 mL | 2 mL | 0.2 mmol | 0.1 mmol | 0.05 mmol | 2 mL |
| 3 | 8 mL | 2 mL | 0.2 mmol | 0.1 mmol | 0.1 mmol | 2 mL |
| 4 | 8 mL | 2 mL | 0.2 mmol | 0.1 mmol | 0.15 mmol | 2 mL |

Procedure

ODE/OA/$Pb(Ac)_2$/CsAc/$Pd(Ac)_2$ were heated to 50° C. under vacuum for 30 minutes. The temperature was then raised to 120° C. under nitrogen. OAmBr in toluene (0.3 $moldm^{-3}$ solution) was injected and the reaction was allowed to take place for 10 seconds before being quenched in an ice bath. Nanocrystals (NCs) were separated by centrifuging with an equal volume of 1-butanol at 8000 rpm for 10 minutes. The supernatant was discarded and the nanocrystals were re-dispersed in n-hexane and filtered. For optical characterisation measurements, the NCs were further diluted in n-hexane.

Optical Characterisation

Figure 19:
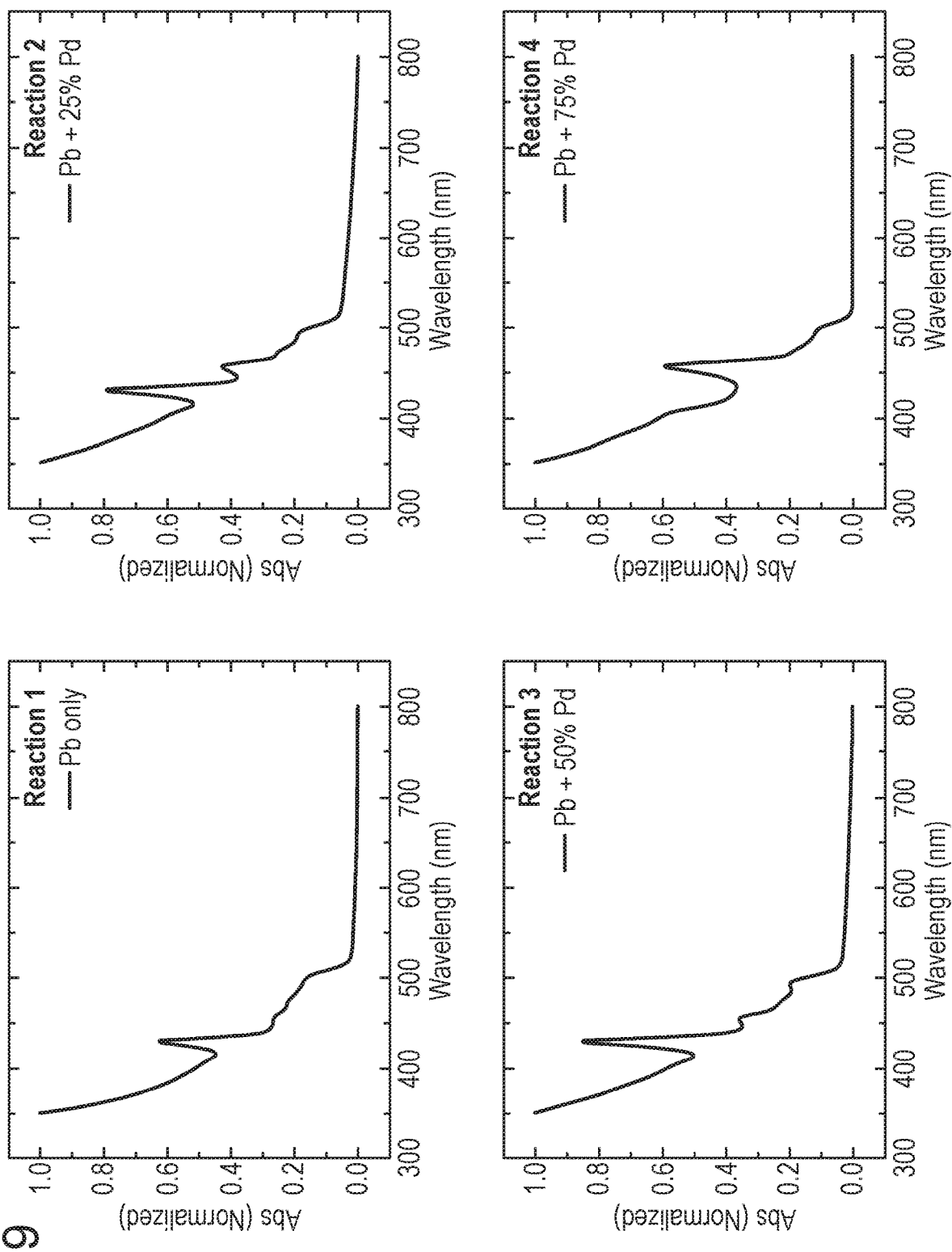
FIG. 19 shows UV-vis absorption spectra of a mixed Pb/Pd material.

The UV-vis spectra of each of the materials obtained from reactions 1 to 4 were measured. The results are shown in FIG. 19.

Figure 20:
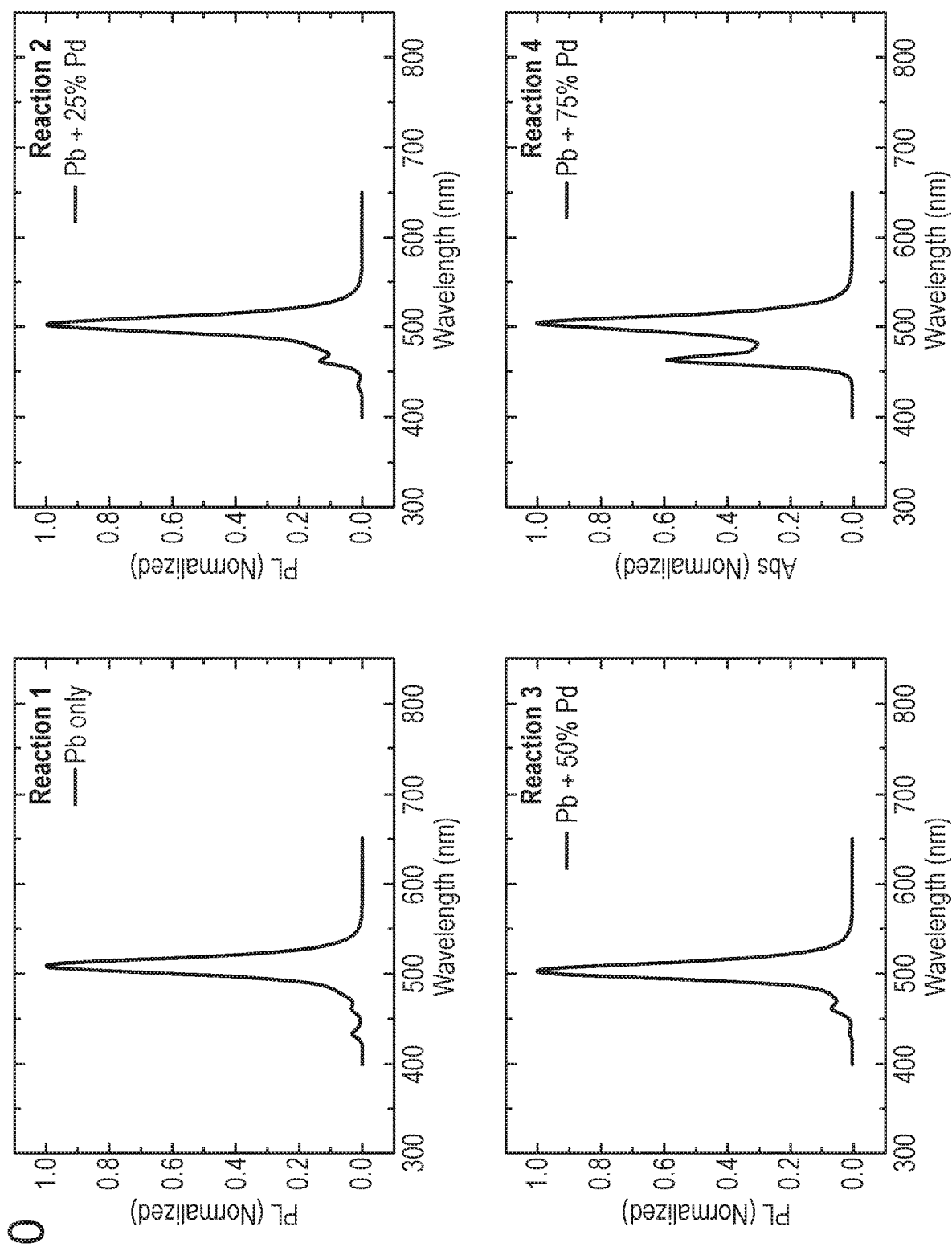
FIG. 20 shows photoluminescence spectra of a mixed Pb/Pd material.

The photoluminescence spectra of each of the materials obtained from reactions 1 to 4 were measured. The results are shown in FIG. 20. The photoluminescence quantum yields are shown in Table 5.

TABLE 5

| Reaction | PLQY (%) |
|---|---|
| 1 | 23.3 |
| 2 | 4.71 |
| 3 | 7.65 |
| 4 | 7.49 |

Time resolved photoluminescence measurements were determined. Spectra were fitted to the stretched exponential giving lifetimes (τ) in nanoseconds. Different excitation wavelengths were used to reflect the two peaks in the emission spectra. The determined lifetimes for each of the materials are given in Table 6.

TABLE 6

| Reaction | Excitation | τ |
|---|---|---|
| 1 | 462 nm | 0.17 ns |
|   | 511 nm | 2.11 ns |

TABLE 6-continued

| Reaction | Excitation | τ |
|---|---|---|
| 2 | 465 nm | 0.08 ns |
|   | 505 nm | 0.17 ns |
| 3 | 465 nm | 0.10 ns |
|   | 505 nm | 0.21 ns |
| 4 | 466 nm | 0.16 ns |
|   | 505 nm | 0.22 |

The invention claimed is:

1. A semiconductor device comprising a semiconducting material, wherein the semiconducting material comprises a halometallate compound comprising:
 (a) cesium;
 (b) palladium; and
 (c) one or more halide anions [X],
and wherein the semiconductor device is an optoelectronic device.

2. A semiconductor device according to claim 1, wherein the one or more halide anions [X] are selected from $Br^-$, $Cl^-$ and $I^-$.

3. A semiconductor device according to claim 1, wherein the semiconducting material comprises a halometallate compound of formula (I):

$$[A]_a[M]_b[X]_c \qquad (I),$$

wherein:
[A] comprises $Cs^+$;
[M] comprises $Pd^{2+}$ or $Pd^{4+}$;
[X] comprises the one or more halide anions;
a is from 1 to 4;
b is from 1 to 2; and
c is from 3 to 8.

4. A semiconductor device according to claim 1, wherein the semiconducting material comprises a halometallate compound of formula (II):

$$[A]_2[M][X]_6 \qquad (II),$$

wherein:
[A] comprises $Cs^+$;
[M] comprises $Pd^{4+}$;
[X] comprises the one or more halide anions.

5. A semiconductor device according to claim 1, wherein the semiconducting material comprises a halometallate compound selected from the group consisting of $Cs_2PdBr_6$, $Cs_2PdCl_6$ and $Cs_2PdI_6$.

6. A semiconductor device according to claim 1, wherein the semiconducting material comprises a halometallate compound of formula (III):

$$[A]_2[M][X]_4 \qquad (III),$$

wherein:
[A] comprises $Cs^+$;
[M] comprises $Pd^{2+}$;
[X] comprises the one or more halide anions.

7. A semiconductor device according to claim 6, wherein the semiconducting material comprises a halometallate compound selected from the group consisting of $Cs_2PdBr_4$, $Cs_2PdCl_4$ and $Cs_2PdI_4$.

8. A semiconductor device according to claim 1, wherein the semiconductor device is a photovoltaic device, a light-emitting device or a photodetector.

9. A semiconductor device according to claim 1, which semiconductor device comprises a layer of the semiconducting material.

10. A semiconductor device according to claim 1, which semiconductor device comprises:
   an n-type region comprising at least one n-type layer;
   a p-type region comprising at least one p-type layer; and, disposed between the n-type region and the p-type region:
   a layer of the semiconducting material.

11. A semiconductor device according to claim 1, which semiconductor device comprises a layer of the semiconducting material without open porosity.

12. A semiconductor device according to claim 1, wherein the semiconducting material is a photoactive material.

* * * * *